(12) United States Patent
Chow et al.

(10) Patent No.: US 7,701,254 B2
(45) Date of Patent: Apr. 20, 2010

(54) RECONFIGURABLE CIRCUITS

(75) Inventors: Alex Chow, East Palo Alto, CA (US); William Stuart Coates, Los Gatos, CA (US); Robert David Hopkins, Hayward, CA (US)

(73) Assignee: Oracle America, Inc., Redwood Shores, CA (US)

( * ) Notice: Subject to any disclaimer, the term of this patent is extended or adjusted under 35 U.S.C. 154(b) by 127 days.

(21) Appl. No.: 12/047,488

(22) Filed: Mar. 13, 2008

(65) Prior Publication Data

US 2008/0228951 A1 Sep. 18, 2008

Related U.S. Application Data

(60) Provisional application No. 60/894,642, filed on Mar. 13, 2007.

(51) Int. Cl.
*H03K 19/00* (2006.01)
(52) U.S. Cl. .......................................... 326/93; 326/46
(58) Field of Classification Search .................... 326/93, 326/46; 327/154, 155, 185; 710/10
See application file for complete search history.

(56) References Cited

U.S. PATENT DOCUMENTS

| | | | |
|---|---|---|---|
| 6,369,614 B1 * | 4/2002 | Ridgway | 326/93 |
| 6,574,690 B1 | 6/2003 | Fairbanks et al. | |
| 6,590,424 B2 * | 7/2003 | Singh et al. | 326/93 |
| 6,946,869 B2 * | 9/2005 | Jacobson et al. | 326/33 |
| 7,285,985 B2 * | 10/2007 | Sasagawa et al. | 326/93 |

OTHER PUBLICATIONS

Brunvand, Erik, "Low Latency Self-Timed Flow-Through FIFOs," IEEE, pp. 76-90, 1995.
Chow et al., "A Configurable Asynchronous Pseudorandom Bit Sequence Generator," 13th IEEE International Symposium on Asynchronous Circuits and Systems, 10 pages, 2007.
Coates et al., "Congestion and Starvation Detection in Ripple FIFOs," Proceedings of the Ninth International Symposium on Asynchronous Circuits and Systems, 10 pages, 2003.
Golomb, Solomon W., "Shift Register Sequences," Aegean Park Press, Walnut Creek, California, ISBN 9-780894-120480, 1982.
Goresky et al., "Fibonacci and Galois Representations of Feedback-With-Carry Shift Registers," IEEE Transactions on Information Theory, vol. 48, No. 11, pp. 2826-2836, Nov. 2002.

(Continued)

*Primary Examiner*—James Cho
(74) *Attorney, Agent, or Firm*—Dorsey & Whitney LLP

(57) ABSTRACT

The present disclosure involves reconfigurable circuits that include an asynchronous data path with asynchronous control and at least one logic element coupled with the asynchronous data path that allows the circuit to be configured to more than one logical implementation through data and control token. In one particular example, the asynchronous data path with asynchronous control includes an interconnection of memory elements, such as latches, with each memory element including a corresponding asynchronous control element, such as a GasP element. One or more logical elements are coupled at one or more points of the data path, such coupling may involve feed-back, feed-forward, or combinations of both, and may include external data connections. Through distribution of data items and control tokens to the asynchronous data path with asynchronous control, the fixed logical coupling to the data path may be reconfigured to provide various logical arrangements.

16 Claims, 25 Drawing Sheets

OTHER PUBLICATIONS

Konstadinidis et al., "Implementation of a Third-Generation 1.1-GHz 64-bit Microprocessor," IEEE Journal of Solid-State Circuits, vol. 37, No. 11, pp. 1461-1469, Nov. 2002.

Lathi, B.P., "Modern Digital and Analog Communication Systems," Third Edition, Oxford University Press, New York, New York, ISBN 0-19-511009-9, Chapters 6 and 10, 1998.

Molnar et al., "Two FIFO Ring Performance Experiments," Proceedings of the IEEE, vol. 87, No. 2, pp. 297-307, Feb. 1999.

Oppenheim et al., "Discrete-Time Signal Processing," Second Edition, Prentice Hall, Upper Saddle River, New Jersey, ISBN 0-13-754920-2, Chapters 7 and 11, 1999.

Sutherland et al., "GasP: A Minimal FIFO Control," IEEE, pp. 46-53, 2001.

* cited by examiner

Fig. 1 (Background) Synchronous Shift Register

Fig. 2 (Background) Feed-Forward Synchronous Shift Register

Fig. 3 (Background) Synchronous Feed-Back Shift Register

Fig. 4 (Background) Synchronous Feed-Forward Shift Register Circuit

Fig. 5 (Background) Synchronous Feed-back Shift Register Circuit

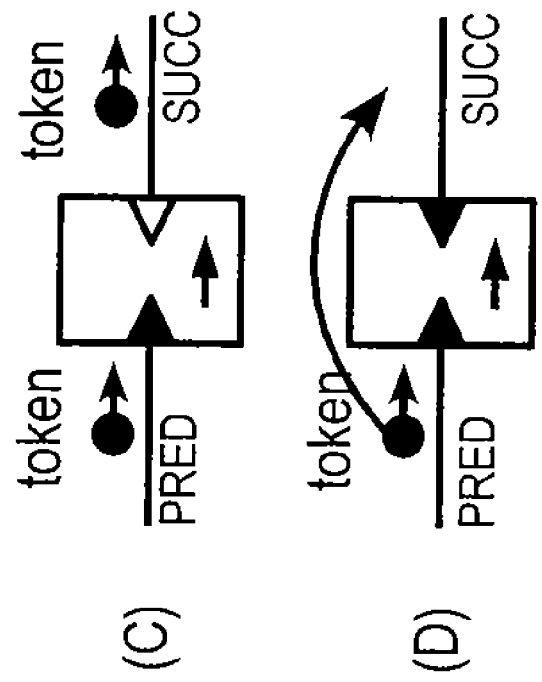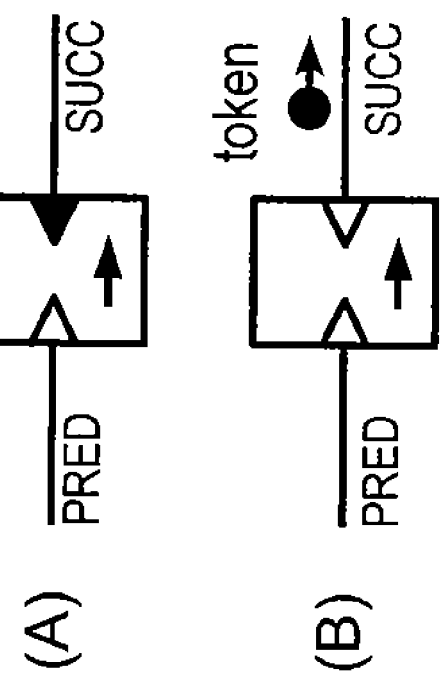
Fig. 6

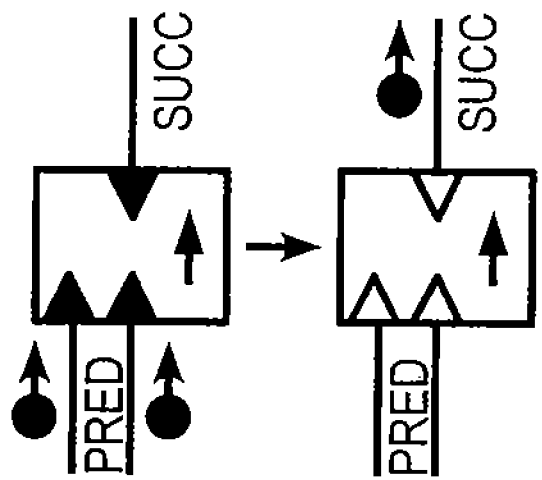
(B)
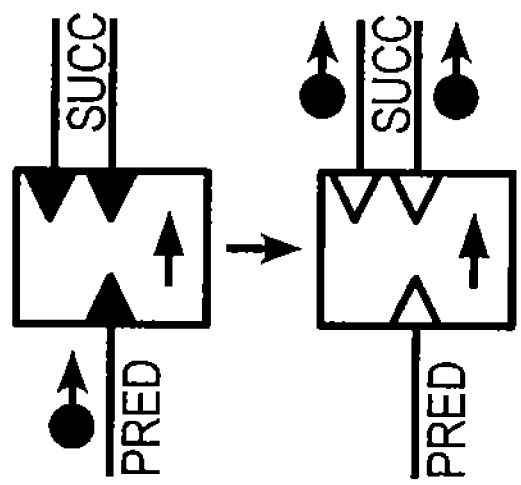
(A)
Fig. 7

RECONFIGURABLE CIRCUITS

CROSS-REFERENCE TO RELATED APPLICATIONS

This patent application claims priority under 35 U.S.C. §119(e) to U.S. Provisional Application No. 60/894,642, filed Mar. 13, 2007 and entitled "Reconfigurable Circuits," the disclosure of which is hereby incorporated by reference herein including all references incorporated by reference in the provisional application.

FIELD OF THE INVENTION

The present disclosure involves the field of logical circuits, and more particularly the field of reconfigurable circuits involving an asynchronous data path with asynchronous control and at least one logic element coupled with the asynchronous data path that allows the circuit to be configured to more than one logical implementation through data and control token initialization.

BACKGROUND

Logic configurability is impractical, and in many instances not possible, with traditional synchronous shift register circuits, especially those that incorporate feed-back paths. The impracticality in providing configurability to synchronous shift register based circuits is a result of the fact that the number of data storage elements in synchronous shift register based circuits strictly governs the number and distribution of logical data bits in the circuit.

In many applications, a system, such as a processor chip or the like, may involve many different permutations of a particular logic algorithm. For example, an encoder may apply different formulae to implement different encoding schemes; a cyclic redundancy checker may apply different formulae to compute different checksums; and spread-spectrum communication systems and cryptographic engines may generate many different random code words.

It is possible to use software to implement variations in the configuration of logic based on a conventional shift register circuit. However, due to performance issues, such as real-time requirements, software based solutions are often not sufficient or compatible with other system requirements. Another possibility, is to implement different permutations of a logic algorithm by simply designing and building a distinct logic circuit for each permutation. Of course, this solution, while likely meeting performance requirements, greatly increases design effort, chip complexity, and the valuable chip real estate.

A conventional synchronous shift register 10 involves a series of data storage elements connected such that data bits propagate serially through the register. FIG. 1 shows one example of a conventional circuit implementation of a synchronous shift register 10, where each data storage element is a latch labeled "L". On every positive clock edge or a clock input of a given latch, each latch copies a data bit from an input to an output of each latch.

A fundamental property of such a synchronous shift register circuit is that the data bit at the input of each storage element is assumed to be valid on every clock edge. Therefore, every register stage stores a valid data item, and the number of register stages (e.g., the number of latches strictly governs the number of data items in the register. An N-stage register stores N bits, and every bit shifts down the register (from one latch to the adjacent latch) by one position on every clock cycle.

Many computational circuits apply combinational logic on bits stored in a shift register. Two conventional shift register circuit families, feed-forward and feed-back, are shown in FIGS. 2 and 3. FIG. 2 shows an example of a feed-forward shift register circuit 12, where some combinational logic block 14 may operate on bits M(3) and N(5) of the shift register. In general, the logic can operate on any number of bits in the register. The logic, however, is limited to operating on bits where there is a connection to the combinational logic, e.g., M(3) (after the third latch L3) and N(5) (after the fifth latch L5). FIG. 3 shows a circuit 16 in a feed-back configuration, where a combinational logic block 18 may operate on an input, e.g., bits M (3) and N (5) of the shift register; the result is fed back to the beginning of the register. In both cases, the combinational logic block may produce one or more outputs. Notably, each circuit is limited by the number of register elements (latches) in the circuit and the position of the connections or taps between the shift register circuit and the combinational logic. A tap copies the value of a data bit and feeds it elsewhere. In the circuits of FIGS. 2 and 3, bits M(3) and N(5) have taps to provide the data to the combinational logic 14 and 18, respectively.

FIGS. 4 and 5 show examples of actual circuits that share the same basic structures as the ones in FIGS. 2 and 3, respectively. The feed-forward circuit 20 of FIG. 4 generates the outputs $$out_0[t] = b_k[t] \wedge b_{k+2}[t]$$
$$out_1[t] = b_k[t] \vee b_{k+2}[t] \quad (1)$$

where t denotes the clock cycle, and $b_k$ and $b_{k+2}$ represent two data bits two positions apart, represents the logical AND operation performed by the AND gate 22, and $\wedge$ represents the logical OR operation performed by the OR gate 24.

Because the number and order of bits in a shift register are strictly bound to the structure of the circuit, each circuit can only implement a set combinational formula. For instance, the circuit of FIG. 4 always produces outputs according to (1). The circuit cannot implement another formula without additional circuitry.

It is possible to attach a tap to every register stage, and include a multiplexer to select a subset of the tapped bits and feed them into different combinational logic blocks. However, this involves a large overhead in circuit complexity and latency, especially if the shift register is very long, i.e., includes a relatively large number of registers. As a result, it is usually more efficient to design a separate register and combinational logic circuit for each permutation of logic to be implemented. While addressing the complexity and some of the latency issues, both the use of a multiplexor as well as deploying separate circuits, can involve substantial chip real estate.

The feed-back circuit 26 of FIG. 5 illustrates another aspect of configurability that is restricted by the use of a simple shift register. The circuit generates the next input bit $b_1$ to the register according to the formula:

$$b_1[t+1] = (b_2[t] \oplus b_5[t]) \oplus in[t]. \quad (2)$$

The symbol + represents the functions performed by the XOR gates 28 and 30, because the input to the register is a function of its current state, the number of data bits in the shift register is pertinent to the correctness of the computation. For example, the circuit of FIG. 5 computes the remainder of a binary division of the input polynomial by the polynomial represented by the shift register structure, in this case $x^5 + x^2 + 1$. It is not possible to use the same circuit to compute the remainder of a division by a polynomial of a different order, for example, $x^7+x^3+1$. This is because there are always five data bits in the shift register, and therefore the circuit can only compute the remainder by a fifth order polynomial. Thus, conventionally, a different circuit must be designed and built for each and every computation. As discussed in greater detail below, polynomial computations of different orders occur in a wide variety of applications.

It may also be possible to build a synchronous pipeline with multiple parallel bypass paths, each with a different number of pipeline stages, and select between these stages to allow configurability. However, as with other conventional solutions set out above, this is complex and may involve a prohibitive amount of overhead and real estate driving designers to implement separate circuits for different computations.

In light of these and other problems in the art, the following disclosure describes various reconfigurable circuit implementations as well as discusses how to build on the base of reconfigurable circuit knowledge set out herein to implement other implementations. Reconfigurable circuits as set out below alleviate the need to build multiple circuits for each computational effort or to deploy other impractical circuit implementations. Further, some of the solutions set out below illustrate how it is possible to decouple the logical data distribution from the physical circuit structure using asynchronous control protocols. By loading different distributions of control tokens into a circuit, it is possible to use one circuit to implement many different desired logical permutations of an algorithm.

SUMMARY

One aspect of the present invention involves a reconfigurable circuit comprising an asynchronous data path with asynchronous control and at least one logic element coupled with the asynchronous data path with asynchronous control. The asynchronous data path and the least one logic element configurable to at least two logical implementations by initializing the asynchronous data path with at least a first combination of valid data items and control tokens and at least a second combination of valid data items and control tokens different from the first combination.

Another aspect of the present invention involves a method of reconfiguring a reconfigurable circuit. The method includes accessing an asynchronous data path with asynchronous control, the asynchronous data path including at least one logic element coupled with the asynchronous data path. The method further includes initializing the asynchronous data path and the least one logic element with a first combination of valid data items and control tokens to achieve a first logical implementation and initializing the asynchronous data path and the at least one logic element with a second combination of valid data items and control tokens to achieve a second logical implementation, the second combination being different from the first combination.

BRIEF DESCRIPTION OF THE DRAWINGS

FIG. 6 is a logic diagram illustrating various states of a GasP element;

FIG. 7A is a logic diagram illustrating a duplicating type GasP element;

FIG. 7B is a logic diagram illustrating a merging type GasP element;

DETAILED DESCRIPTION

Figure 1:
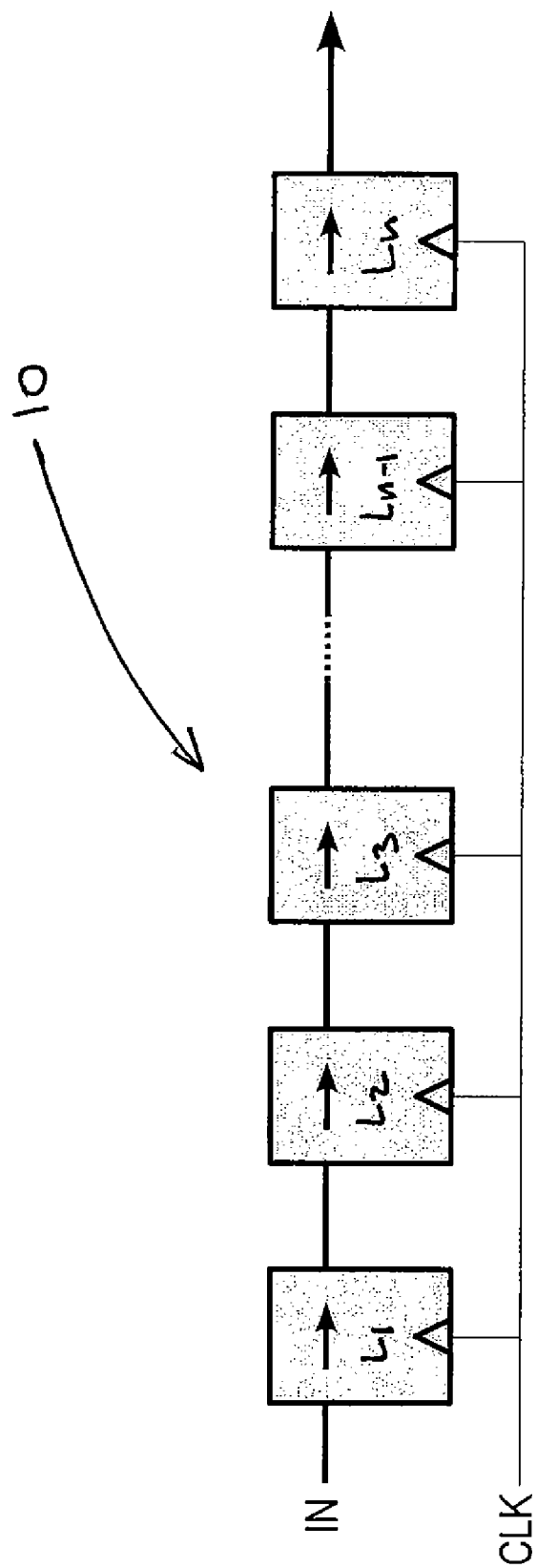
FIG. 1 is a circuit diagram illustrating a synchronous shift register.

Aspects of the present invention involve reconfigurable circuits with an asynchronous data path with asynchronous control. The storage elements of the asynchronous data path, which may be latches, include a corresponding control element (the asynchronous control) that facilitate the implementations of a handshaking protocol between adjacent stages in order to satisfy local timing constraints to ensure reliable data propagation. Unlike synchronous shift registers, not all storage elements in a reconfigurable circuit necessarily contain valid data. Instead, the validity of data at the input to each storage element is governed by the presence of a token at the control element of the preceding storage element. The valid data item along with the control token are passed to the following stage (storage element and control element) when the next stage is available to receive the data. This is contrary to a synchronous shift register in which every stage contains a valid data bit and valid data bits are moved from one latch to the next based on the clock.

An asynchronous control protocol provided by the reconfigurable circuits set forth herein allows for the effective decoupling of logical bit distribution from the physical structure of a circuit. This property may be exploited to implement many different permutations of a logically implemented algorithm with a physical circuit implementation allowing for different logical permutations by different data and control token distributions.

Reconfigurable circuits conforming to aspects of the present invention may include asynchronous control elements, such as GasP or asP elements as discussed in A. Chow, W. Coates, and D. Hopkins, "A Configurable Asynchronous Pseudorandom Bit Sequence Generator," 13th IEEE Symposium on Asynchronous Circuits and Systems, March 2007 and 1. Sutherland and S. Fairbanks, "GasP: A Minimal FIFO Control," in 7th International Symposium on Advanced Research in Asynchronous Circuits and Systems, 11-14 Mar. 2001, pp. 184-193, both of which are hereby incorporated by reference herein.

FIGS. 6A-6D show one variety of a GasP element using standard notation, with the addition of arrows that corresponds to the direction of data flow. The element has two ports, shown as triangular arrowheads. When an arrowhead is unshaded, it is inactive; when shaded, it is active. State wires connect ports of different GasP elements. A GasP element 'fires' when all of its ports are active (see FIG. 6), after which the ports are reset to the inactive state. Firing toggles the state of the ports of other GasP elements connected to the firing element. In addition, when a GasP element fires, it briefly makes transparent an associated data latch (discussed below), copying data from the latch's input to its output. As discussed herein, the port that corresponds to the token input of a GasP control element is referred to as the "predecessor" port and the port corresponding to the token output of a GasP element is the "successor" port.

A token as used herein is an abstraction applied to state wires that indicate the validity of data in the latch corresponding to the control element. Stated differently, when valid data exists at the output of the latch being controlled by the GasP module, a token exists at the successor port (FIG. 6[B,C]). A token at the successor port renders the successor port inactive because the control module cannot fire if the data has not yet been captured by the successor stage. A token at the predecessor port (FIG. 6[C,D]), on the other hand, makes the predecessor port active, because the element's predecessor has valid data (in the associated latch) that is ready to be accepted. Only if a token exists at the predecessor and no token exists at the successor (FIG. 6[D]) would both ports be active, and the module can fire. Upon firing, the token is moved from the predecessor to the successor port, and both ports are set to the inactive state (FIG. 6[B]).

When a data path splits or merges (as will be discussed below), a GasP module with more than one input or output may be employed to duplicate or merge tokens, examples of which are shown in FIG. 7. They operate using the same protocol as the GasP module; all three ports must be active in order for them to fire. The control element shown in FIGS. 7A and 7C is a token duplicator and has two successors; when it fires (FIG. 7A), the token at the predecessor is moved to both successor ports (FIG. 7C). The control element shown in FIGS. 7B and 7D is a token merger and has two predecessors; when it fires, the two tokens at both predecessors are removed and one is placed at the successor port.

FIGS. 8-13 and 11-22 illustrate various examples of reconfigurable circuit topologies that involve various aspects of the present invention. Each of the reconfigurable circuits includes an asynchronous data path with asynchronous control and some of various possible means for performing a logical operation (e.g., 106, (114, 116), 126, 136, 146, etc.) tapped or otherwise operably connected to the circuit. FIGS. 15A-15D provide a detailed example of a pseudo random bit sequence generator with the operation of a PRBS using a reconfigurable circuit conforming to aspects of the invention. The discussion of FIGS. 15A-15D provides details as to how tokens move through the circuit in coordination with data.

Figure 8:
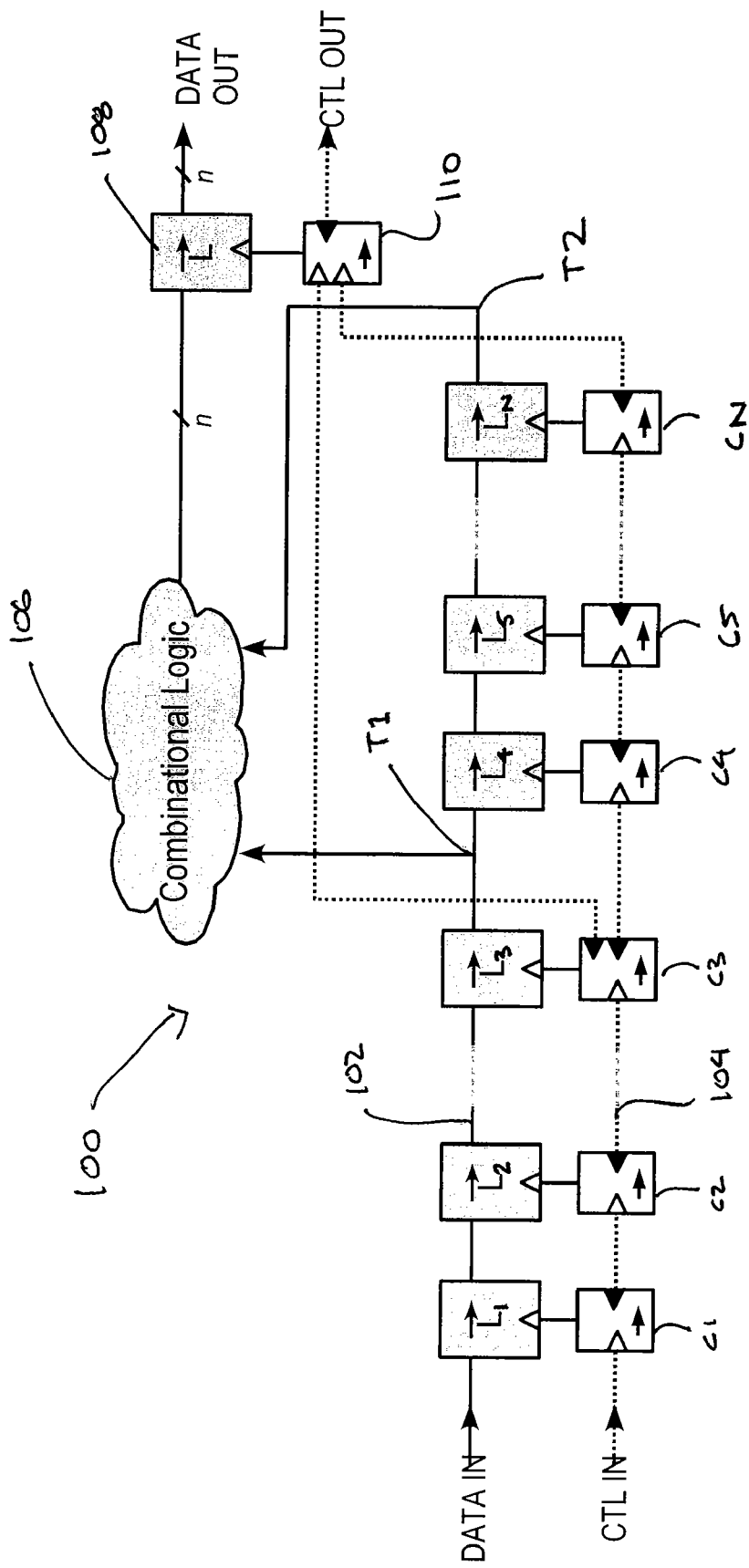
FIG. 8 is a circuit diagram illustrating a reconfigurable circuit with feed forward logic according to one general implementation.

Turning now FIG. 8, a generic structure of a two-tap feedforward reconfigurable circuit 100 with an asynchronous data path with asynchronous control is shown. The circuit, like others discussed herein, can be generalized into a structure with an arbitrary number of taps. In this and other drawings, a data path 102 is shown in solid lines, while a control (token) path 104 is shown in dashed lines. Storage elements are latches, and are represented by boxes labeled 'L'. In the control path, GasP control elements are shown using the notation presented above with reference to FIGS. 6 and 7 and are labeled 'C'. The combination of a latch, e.g., L1, and the corresponding GasP control element, e.g. C1, may be referred to as a stage. Various implementations conforming to aspects of the invention may build on an asynchronous data path with asynchronous control as discussed herein. Unlike a synchronous circuit where data moves from memory element to memory element according to a distributed clock, an asynchronous data path with asynchronous control as discussed herein propagates data through the data path in response to the presence of tokens in the control path. Further, in the asynchronous data path with asynchronous control discussed herein, valid data items are also associated with a token. Hence, fewer than all storage elements may have a valid data item. Moreover, data moves through the circuit responsive to the presence of a token, not all data elements move synchronously as with the circuits of FIGS. 1-5. While the reconfigurable circuits discussed herein are asynchronous, it is possible to provide the data output of the circuit to a clock interface stage or other synchronous circuit structure and hence provide a synchronous output.

Unlike conventional synchronous shift register circuits, the number of stages and physical tap positions in the asynchronous data path with asynchronous control do not strictly govern the logical distribution of bits in the data path. As a result, there can be a difference between physical stages and taps, and logical stages and taps. In the circuit of FIG. 8 as well as others discussed herein, there are N' physical stages between the two taps T1 and T2. However, the number of logical bits between the taps may be different, and we will denote this as $N \leq N'$ where N is the number of logical stages. For a conventional synchronous shift register, the number of logical bits equals the number of physical stages; thus N'=N.

Figure 2:
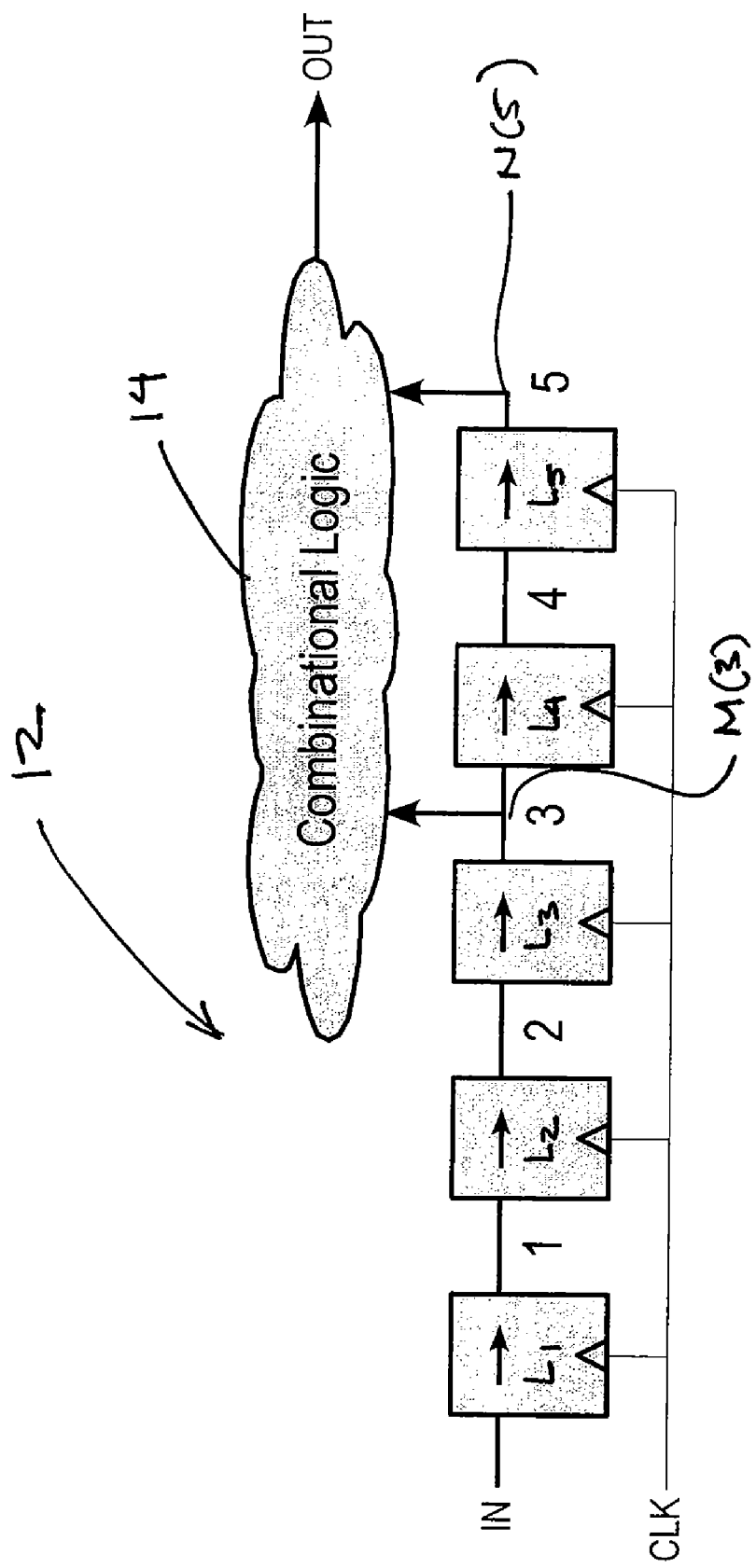
FIG. 2 is a circuit diagram illustrating a feedforward synchronous shift register.
Figure 3:
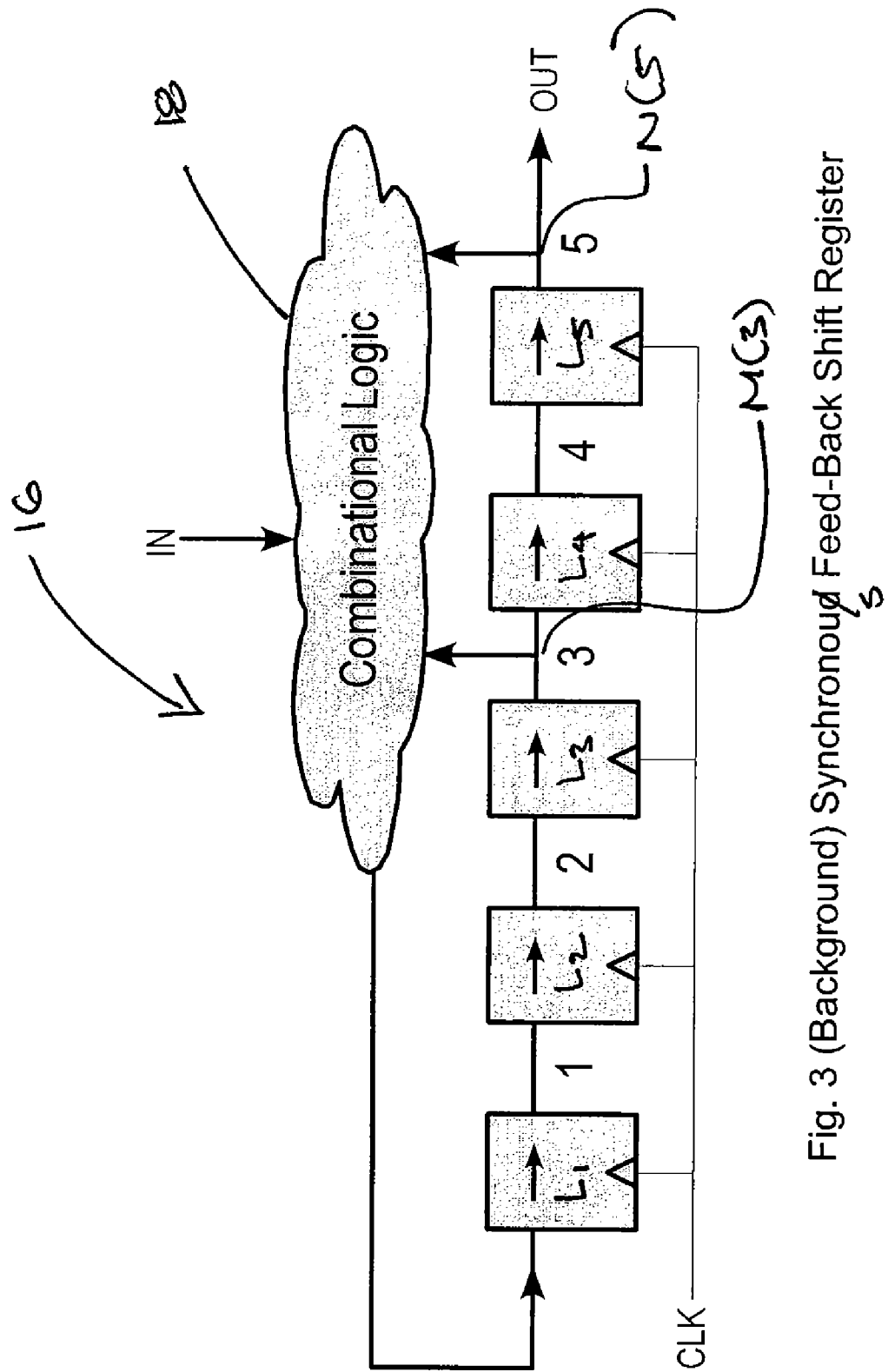
FIG. 3 is a circuit diagram illustrating a feedback synchronous shift register.

The reconfigurable circuit with asynchronous data path with asynchronous control 100 implementation of FIG. 8 works very differently compared to the traditional shift register implementation of FIG. 2. Specifically, in the case of the conventional shift register;

(1) every latch contains a valid data item,
(2) every bit shifts by one position on every clock cycle, and
(3) all bits shift at the same moment synchronously with the clock.

In the case of the reconfigurable circuit of FIG. 8 and others:

(1) not all storage elements necessarily contain data, because the validity of data in each element is governed by the presence of a token at the successor port of the corresponding GasP module, and
(2) the valid data items may propagate at different times and may propagate at different speeds, because the movement of each data item is locally governed by the control token at the corresponding GasP module.

A combinational logic block 106 is connected to the asynchronous data path with asynchronous control at the two tap locations T1 and T2. To implement the correct logical operation of the circuit, the combinational logic block operates on the data bits at two specific logical locations in the sequence, and the proper bit sequence should be maintained. In a conventional arrangement as discussed with respect to FIG. 2, this condition is automatically satisfied by the shift register circuit since each stage stores exactly one bit, and all bits propagate together on each clock cycle. However, in the asynchronous data path with asynchronous control implementation, the validity of data is governed by control tokens; thus, tokens are synchronized with data to provide correct data sequencing. The output of the combinational logic is fed to an output latch 108, which is coupled with a merging GasP element 110. The output is valid when there is a token at the successor part of the merging GasP.

Figure 4:
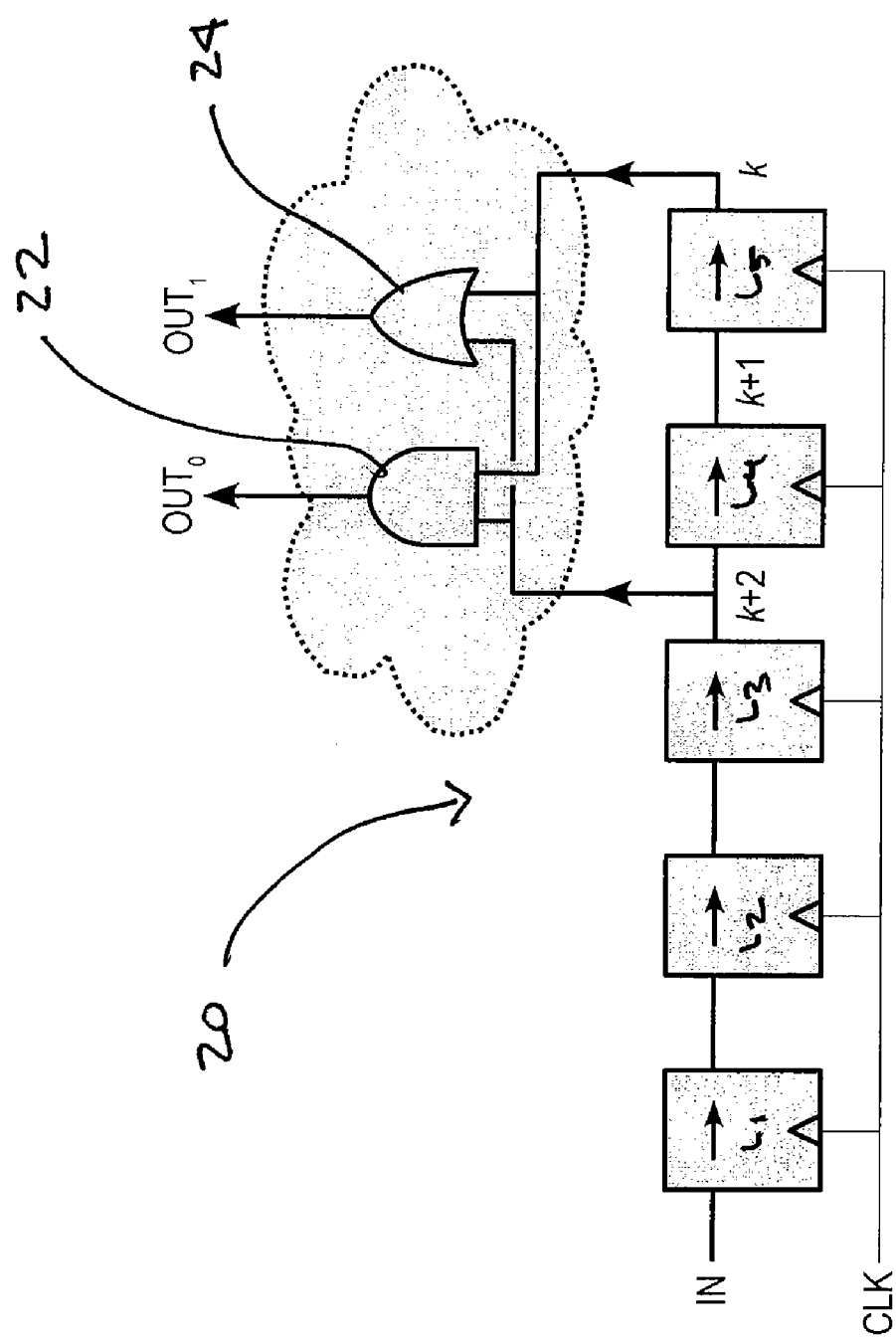
FIG. 4 is a circuit diagram illustrating a synchronous feed forward shift register.
Figure 9:
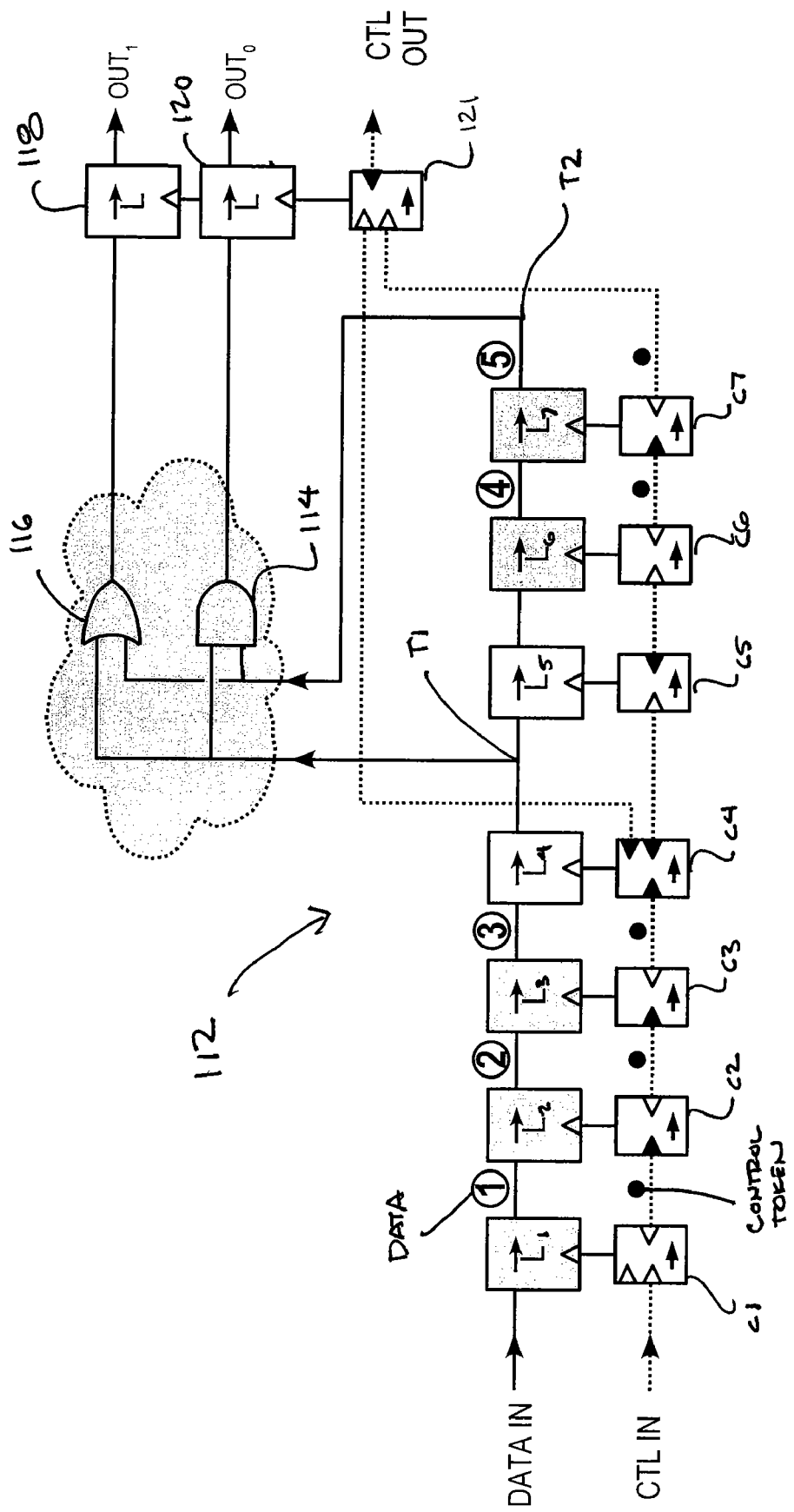
FIG. 9 is a circuit diagram illustrating a reconfigurable circuit with feed forward logic according to one particular implementation.

FIG. 9 provides one particular example of a reconfigurable logic circuit 112 that provide the same output as the shift register logic circuit 20 of FIG. 4. The circuit operates on two bits that are two positions apart, and generates two outputs according to (1). To implement the same logical bit ordering in the asynchronous data path with asynchronous control logic of FIG. 9, the circuit is configured with an appropriate distribution of tokens. Namely, there are two tokens between the two taps at successor ports of control element C6 and C7 and three tokens at the successor parts of control elements C1, C2, and C3.

FIG. 9 is annotated to show the initial data and token configuration that allows it to generate outputs according to (1). Data items are shown as large labeled circles (①, ②, ③, ④, and ⑤) control tokens as small black circles. The numbered data items represent the five valid bits in the data path; their validity is accompanied by the presence of control tokens in the corresponding control state wires. There is a tap T1 following the fourth latch L4 and a tap T2 following the seventh latch L7. Four physical latches L1-L4 precede tap T1, and there are three physical latches L5-L8 between tap T1 and tap T2. However, due to the presence of three control tokens at latches L1-L3 and no control tokens at latch L4, there are three logical stages L1-L3 preceding tap T1. Further, due to the presence of two control tokens at latches L6 and L7 and no control token at latch L5, there are two logical stages L6 and L7 between taps T1 and T2. Hence, the physical number of stages of the circuits of FIGS. 4 and 9 are not the same, but the logical distribution of stages is the same. Note, in order to satisfy timing constraints in the control path, a delay that matches that of the combinational logic block should be inserted correspondingly in the control path; this delay is not shown.

Taps T1 and T2 feed data into the AND gate 114 and the OR gate 116 to provide the output to output latches 118 and 120. Unlike the conventional synchronous circuit of FIG. 4, the output of the logic (114, 116) are fed to a pair of output latches 118, 120. The output latches have a common control element 122 (merging type GasP). Valid data is present at the output latches when a token is at the predecessor part of the control element 121.

Unlike the synchronous shift register implementation of FIG. 4, the reconfigurable circuit of FIG. 9 is configurable to operate on different bits within the asynchronous data path with asynchronous control. For instance, the same circuit can be configured to instead operate on data items three positions apart, and generate outputs according to $$out_0[t]=b_k[t] \wedge b_{k+3}[t]$$

$$out_1[t]=b_k[t] \vee b_{k+5}[t]. \quad (3)$$

Figure 10:
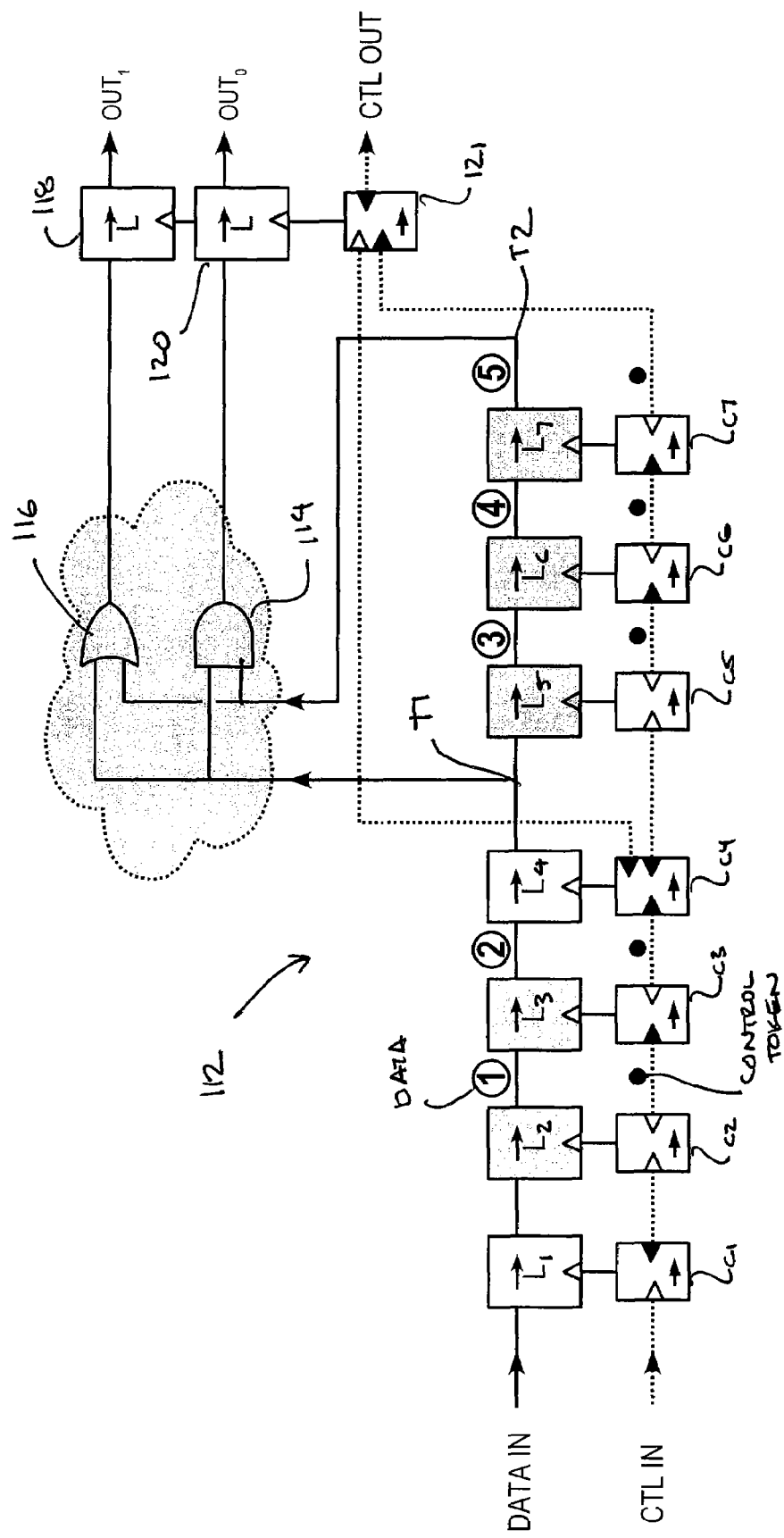
FIG. 10 is a circuit diagram illustrating the reconfigurable circuit of FIG. 9 and illustrating data and control token distribution in comparison to that illustrated in FIG. 9.

This is possible by simply loading a different initial distribution of tokens into the data path, as shown in FIG. 10. The reconfigurable circuit 112 of FIG. 10 is physically the same as the reconfigurable circuit 112 of FIG. 9. However, the initial distribution of tokens is different. Namely, there are control tokens at the successor ports of control elements C2 and C3 causing the data values (1) and (2) at latches L2 and L3 to be considered valid. Further, there are control tokens at each of the successor ports of control elements C5, C6, and C7 causing the data values (3), (4) and (5) at latches L5-L7 to be considered valid. Thus, the logical arrangement of the circuit of FIG. 10 is different than the logical arrangement of the circuit of FIG. 9.

Figure 11:
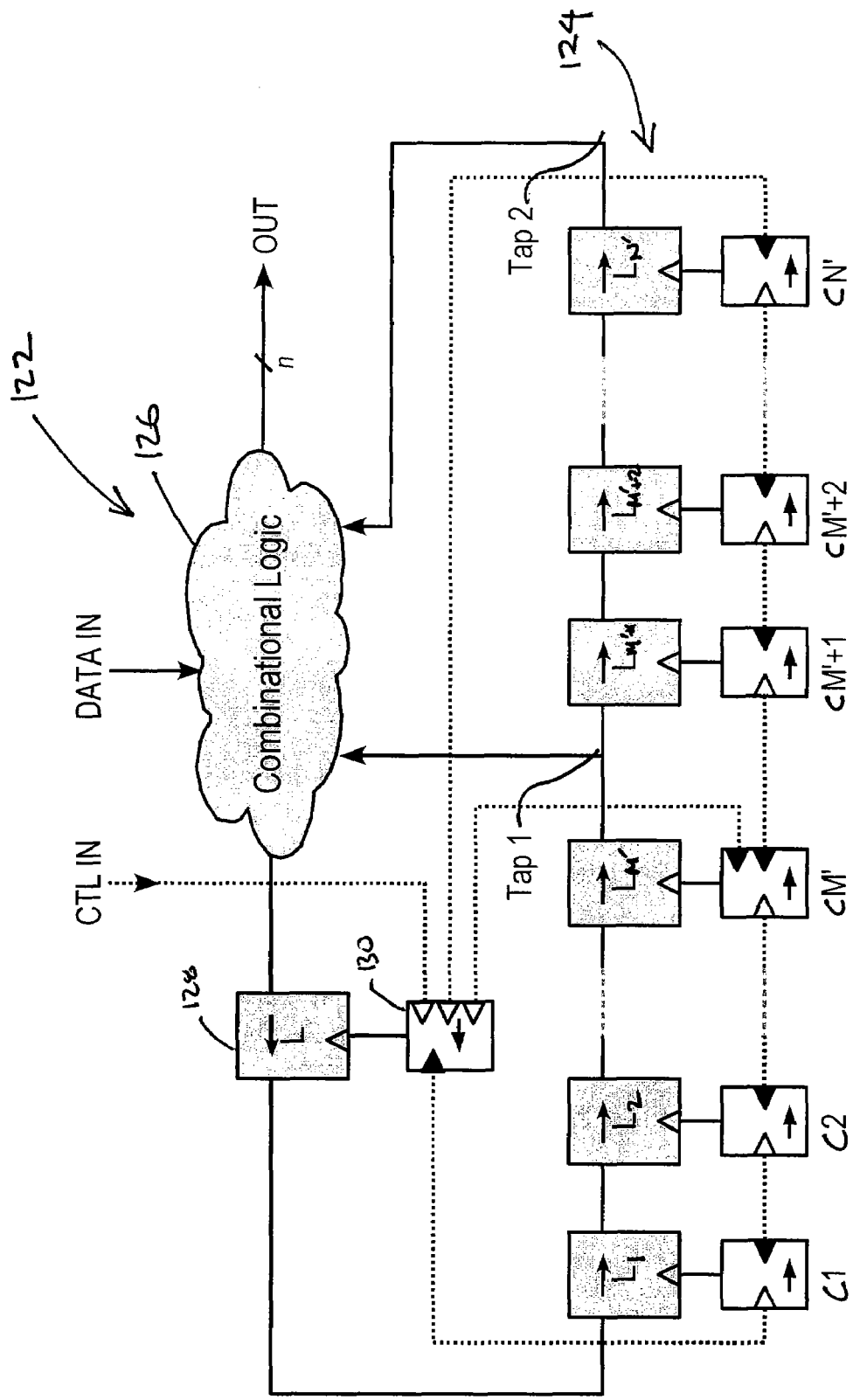
FIG. 11 is a circuit diagram illustrating a reconfigurable circuit with a feedback logic path according to one general implementation.

FIG. 11 shows the basic structure of a reconfigurable two-tap feed-back circuit 122 using an asynchronous data path with asynchronous control ring 124. This circuit can be generalized into a structure with an arbitrary number of taps (T1, T2) connected to logic 126 of some form. The logic may include external inputs (data IN) as well as data from taps (T1, T2, etc) to the of asynchronous data path with asynchronous control ring. It may also produce one or more outputs which are not shown. In some applications, the circuit may not actually produce an explicit output; instead, the result of the computation is the bit string stored in the data path. Also note that the combinational logic block 126 may be partitioned into multiple parts and spread between multiple groups of taps.

Again, with the feed-forward case it is proper to differentiate physical stages and taps against logical stages and taps, since the number of stages and physical tap positions in the asynchronous data path do not strictly govern the logical distribution of bits in the ring. The notations for the feed-back configuration are also slightly different from those of the feed-forward case. In the circuit of FIG. 11, the physical tap positions (T1, T2) are denoted as [M', N']. The logical tap positions may be different, and we will denote these as [M, N]. For a conventional synchronous shift register, the physical stages are the same as the logical stages; thus M'=M and N'=N.

The output of the combinatorial logic 126 may include a feed-back loop to the beginning (L1) of the asynchronous control portion of the reconfigurable circuit. The feed-back loop includes a latch 128 and a merging control element 130. The data from the combinatorial logic block and stored in the latch is provided to the start of the data path when a control token is present at the successor port of the control element 130.

Feed-back configurations are particularly interesting from a configurability perspective, because they illustrate how it is possible to configure not only the distribution but also the number of logical bits in the data path.

In conventional shift register circuits, it is not possible to alter the number of data bits in the register, because the number of register stages governs the number of logical bits. For most feed-back computations, this also means that the memory depth of the logical operation performed by the circuit is fixed by design. For example, suppose the combinational logic block computes the modulo-2 sum (exclusive-OR) of all its inputs. This calculates the remainder of a binary division of the input by the polynomial represented by the shift register structure. It is not possible to use the same circuit to compute the remainder of a division by a polynomial of a different order, because the register polynomial is fixed.

Using asynchronous data path with asynchronous control, on the other hand, one can configure the circuit to compute the remainder of a division by many different polynomials, even ones of different orders, because it is possible to change the polynomial simply by loading different numbers and distributions of tokens in the control elements.

Figure 5:
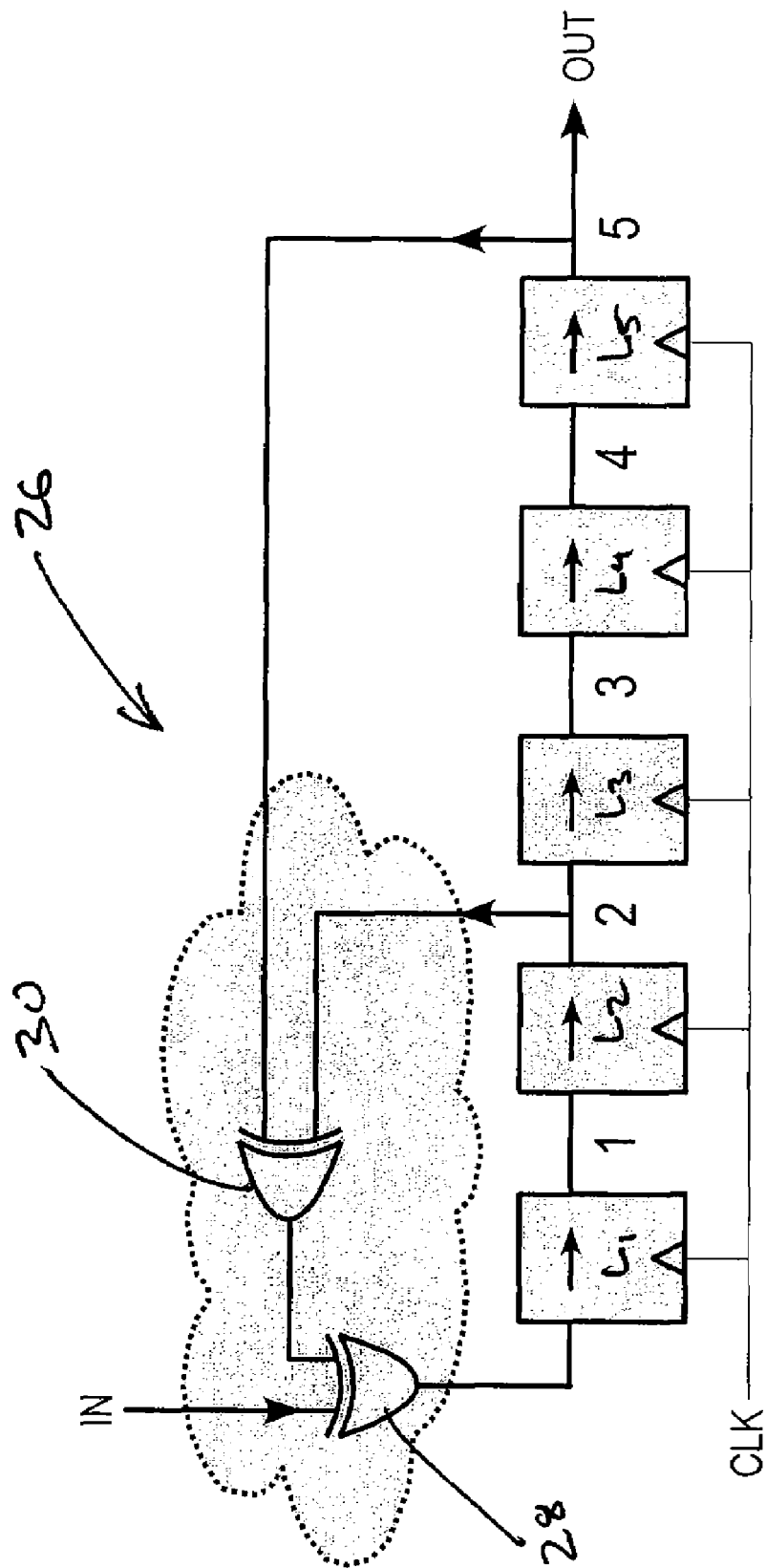
FIG. 5 is a circuit diagram illustrating a synchronous feed back shift register.

First, consider a reconfigurable circuit that achieves the same computation as the shift register circuit of FIG. 5. This circuit computes the cyclic redundancy checksum CRC-5. This checksum is the remainder of a polynomial division by $x^5+x^2+1$. Note, that the circuit operates on bits 2 and 5. The next input is generated from the current state according to (2).

Figure 12:
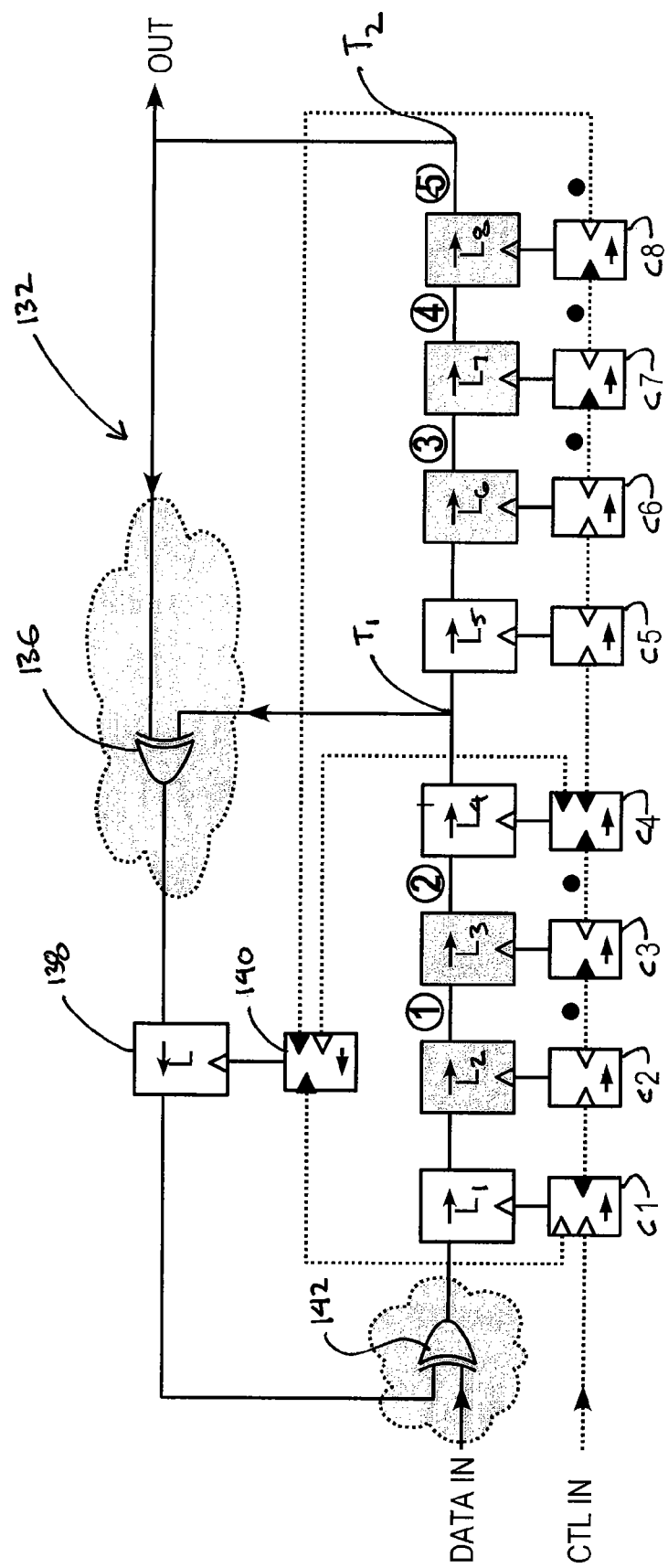
FIG. 12 is a circuit diagram illustrating a reconfigurable circuit with a particular feedback logic path according to one implementation.

To implement the same logical bit ordering in the reconfigurable circuit, the circuit is configured with an appropriate distribution of tokens, in this case two tokens before the first tap, and three tokens between the taps, as shown in FIG. 12. More particularly, FIG. 12 illustrates a reconfigurable circuit 132 that, with the appropriate distribution of tokens, can be configured to provide the same cyclic redundancy checksum as the that of FIG. 5. The circuit includes an asynchronous data path with asynchronous control portion 134 that has four latches (L1-L4) preceding a first tap (T1) and four latches (L5-L8) between the first tap and a second tap T2. Hence, the asynchronous data path with asynchronous control includes eight physical stages. Each tap feeds data to an XOR gate 136. The output of the XOR gate is fed to latch 138, which includes control element 140. The output of the latch 138 is fed back to the asynchronous data path with asynchronous control by way of a second XOR gate 142. To achieve the same calculation as the synchronous circuit of FIG. 5, tokens are initially propagated to successor ports of control elements C2 and C3 by way of the control input line to the first control element C1, which is merging type GasP element, making the data at the output of latches L2 and L3 valid. Tokens are also propagated to the successor ports of control elements C6, C7, and C8, making the data at the output of latches L6, L7 and L8 valid. Hence, there are five logical stages of the eight total stages of the asynchronous data path with asynchronous control, the five logical stages by way of the appropriate distribution of tokens creating a circuit functionally equivalent to the circuit of FIG. 5, with two active stages before the first tap, and three active stages between the taps, with each tap feeding into an XOR logic gate. However, as illustrated in the example below, the circuit of FIG. 12 may be reconfigured to provide different logical arrangements whereas the circuit of FIG. 5 is fixed.

In order to keep the tokens and data in this initial state, a stopper mechanism keeps stage four (L4, C4) from firing regardless of whether or not its ports are all active. We do not need a stopper at stage eight (L8, C8) because the feed-back stage will not fire without a token from stage four (L4, C4). Also, matching delays should be inserted at the appropriate locations in the control path to satisfy timing assumptions; these delays are not shown.

Figure 13:
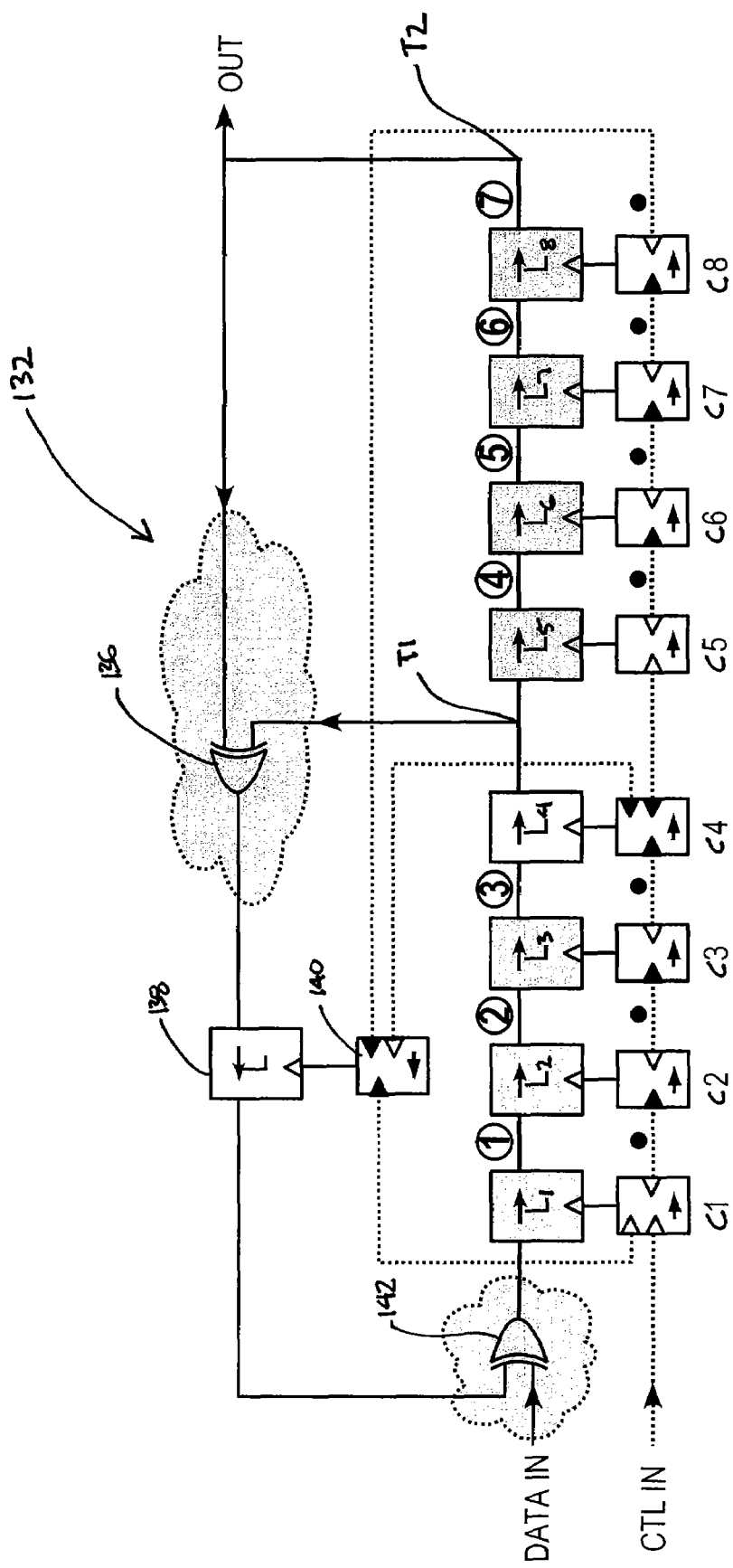
FIG. 13 is a circuit diagram illustrating the reconfigurable circuit of FIG. 12 and illustrating data and control distribution in comparison to that illustrated in FIG. 12.

Unlike the synchronous shift register implementation of FIG. 5, the asynchronous data path with asynchronous control of FIG. 12 is reconfigurable to compute remainders of divisions by many different polynomials, even those of different orders. For instance, it is possible to use the same circuit to instead generate the checksum CRC-7, which is the remainder of a division by the polynomial $x^7+x^3+1$. To implement the CRC-7 checksum, the same circuit 132 may be used, with a different distribution of tokens as shown in FIG. 13. Namely, tokens are distributed to all but the fourth stage (L4, C4), making data valid at all but the fourth stage.

Configurability for different-order polynomials is not possible with a synchronous shift register implementation, because the structure of the shift register fixes the divisor polynomial. With a reconfigurable circuit, however, one can configure the circuit to compute remainders of divisions by different-order polynomials simply by loading the circuit with different numbers of tokens. Hence, to use the circuit of FIG. 12 to instead compute CRC-7, three tokens are loaded before the first tap, and four tokens between the two taps, as shown in FIG. 13.

Figure 14:
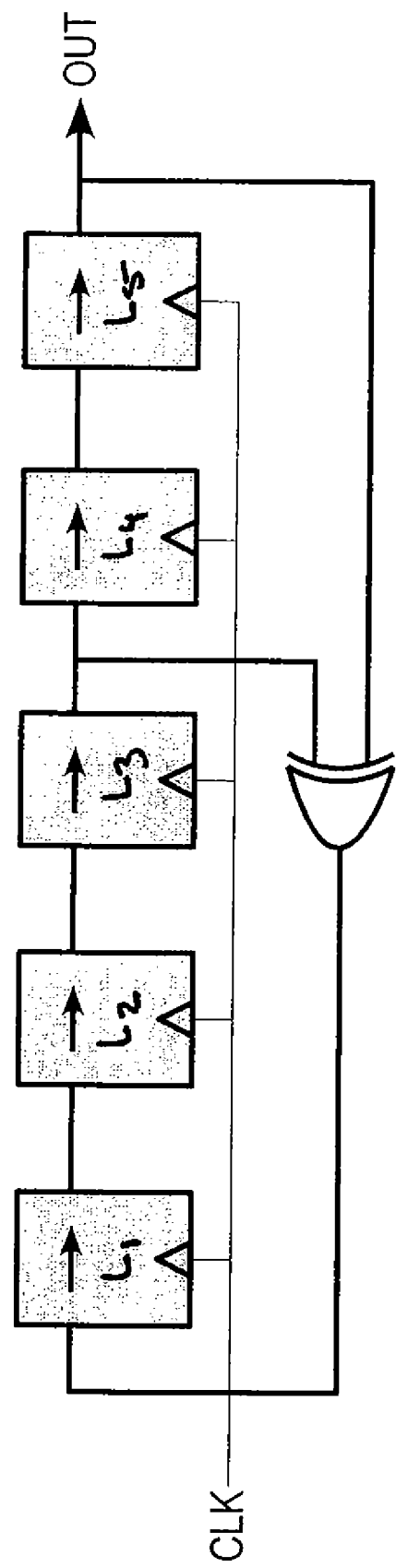
FIG. 14 is a circuit diagram of a synchronous pseudo random bit sequence generator.

To contrast one particular conventional non-reconfigurable circuit with one particular example reconfigurable circuit conforming to aspects of the present invention, a conventional pseudo random bit sequence (PRBS) generator is described followed by a reconfigurable pseudo random bit sequence generator. FIG. 14 illustrates a conventional 5-stage linear feedback shift register with taps at positions 3 and 5 to produce a pseudo random bit sequence (PRBS). FIGS. 15(A)-15(D) illustrate a reconfigurable pseudo random bit sequence generator 144 operating according to various principles of the present invention. FIG. 16 is a table illustrating the states of the PRBS generator of FIGS. 15(A)-15(D). Namely, the first row of table of FIG. 16 illustrates the state of the PRBS generator illustrated in FIG. 15(A), the second row illustrates the state of the PRBS generator illustrated in FIG. 15(B), and so on. The shaded and numbered circles 6-8 represent the operation of the XOR gate.

Generally speaking, pseudo random bit sequences are deterministic binary sequences with properties that resemble those of bandlimited white noise. These sequences are balanced, meaning they have an equal number of '1' and '0' bits to within one bit.

Conventionally, PRBS patterns are generated using synchronous shift register circuits, which will be discussed in detail with respect to FIG. 14. In order to generate a true PRBS with the aforementioned properties, the tap configuration of the shift register (which defines the generator polynomial) is determined using Galois mathematics. We note that an N-stage register can produce an $N^{th}$ order PRBS, provided it has a tap configuration given by the nonzero coefficients of a primitive polynomial factor of $x^L+1$, where $L=2^N-1$, and $$x^L + 1 = \prod_k (t_{M_k} x^{M_k} + t_{M_k-1} x^{M_k-1} + \ldots + 1)_k. \tag{4}$$

The primitive polynomials are the factors where $M_k=N$.

An N-stage register with a valid tap configuration will generate a true PRBS, also known as a maximal-length sequence, with a period of $L=2^N-1$. A maximal-length sequence encompasses every single N-bit pattern, except the all-zero string. This indicates that the generated bit pattern does not depend on the initial state of the register, provided it is not all-zero. Different initial conditions only result in time shifts of the sequence, with no change to its logical properties.

In conventional synchronous implementations, each shift register circuit can produce only one specific PRBS. This is because the shift register structure strictly defines the generator polynomial. Many applications, however, use multiple patterns, and in these conventional cases one must design and build a circuit for each and every pattern. Aspects of the reconfigurable circuits discussed herein, however, through distribution of valid data items and corresponding control tokens, are able to be used to generate different PRBS patterns.

Referring first to FIG. 14, a conventional PRBS includes a series of five latches (L1-L5), with an output of the first latch coupled with the input of a second latch, an output of the second latch coupled with an input of the third latch, and an output of the third latch coupled with an input of an XOR logic gate at tap T1. The output of the third latch is also coupled with an input to a fourth latch, and an output of the fourth latch coupled with an input to a fifth latch. The output of the fifth latch is also coupled with an input of an XOR gate 146, and the output of the fifth latch is also the PRBS output. An output of the XOR gate provides the input to the first latch. This conventional PRBS generates a repeating 31 bit sequence. The beginning of the sequence depends on the initialization of each latch. The following table illustrates the first 10 outputs of the PRBS with a starting sequence of 10101. Note, column 6 denotes the output of the fifth latch, which is the output of the PRBS as well as one of the inputs to the XOR gate.

|  | Latch 1 | Latch 2 | Latch 3 | Latch 4 | Latch 5 (Output) |
|---|---|---|---|---|---|
| Initialization, clock 1 | 1 | 0 | 1 | 0 | 1 |
| clock 2 | 0 | 1 | 0 | 1 | 0 |
| clock 3 | 0 | 0 | 1 | 0 | 1 |
| clock 4 | 0 | 0 | 0 | 1 | 0 |
| clock 5 | 0 | 0 | 0 | 0 | 1 |
| clock 6 | 1 | 0 | 0 | 0 | 0 |
| clock 7 | 0 | 1 | 0 | 0 | 0 |
| clock 8 | 0 | 0 | 1 | 0 | 0 |
| clock 9 | 1 | 0 | 0 | 1 | 0 |
| clock 10 | 0 | 1 | 0 | 0 | 1 |

The PRBS of FIG. 15(A-D) also generates a pseudo random sequence. Depending on the initial distribution and number of tokens a number of different possible pseudo random sequences may be generated. To illustrate some of the concepts set forth herein as well as illustrate how the reconfigurable circuit of FIGS. 15 (A-D) may be operated to achieve the same pseudorandom sequence of FIG. 14, a particular distribution of data and tokens is described.

The PRBS generator of FIG. 15 includes a first stage (S1) coupled with a second stage (S2), with a first tap T1 between the first and second stage and a second tap T2 at an output of the second stage. Each tap is connected to an input of an XOR gate 146. Each stage includes four storage elements, which are shown as latches L1-L4 and L5-L8. The storage elements are labeled sequentially, L1, L2, etc. The latches define a data path. Each storage element includes a data input 148 and a data output 150, and a control input 152, which are only labeled with respect to latch L1 for clarity. Data at the input of the latch is available at the output of the latch when the control input receives the appropriate signal. The fourth latch (L4) provides data at the tap T1 and to the input of the fifth latch L5 (which is the input of the second stage). The eighth latch (L8) provides data to the second tap T2 and as an output of the PRBS.

In this implementation, a plurality of control devices, which may be GasP, asP, or similar logic elements, are coupled with the control inputs 152 of the latches. Each control element is also labeled sequentially, C1, C2, etc. The fourth control element is a duplicating type GasP module. The fourth element has one successor port coupled with a predecessor port of the ninth control element, which is a merging type GasP module. Similarly, the eighth control element has the successor port coupled with a predecessor port of the ninth control element. The second successor port of the fourth element is coupled with a predecessor port of the fifth control element. The successor port of the eighth control element provides the control output. The eighth control element may also be a duplicating GasP element in an alternative configuration of the circuit, with a second successor part providing the control output. The ninth latch (L9) and corresponding ninth control element (C9) are associated with the output of the XOR gate 148 as well as the input to the first latch L1, and token distribution to the predecessor port of the first control element C1.

Figure 15A:
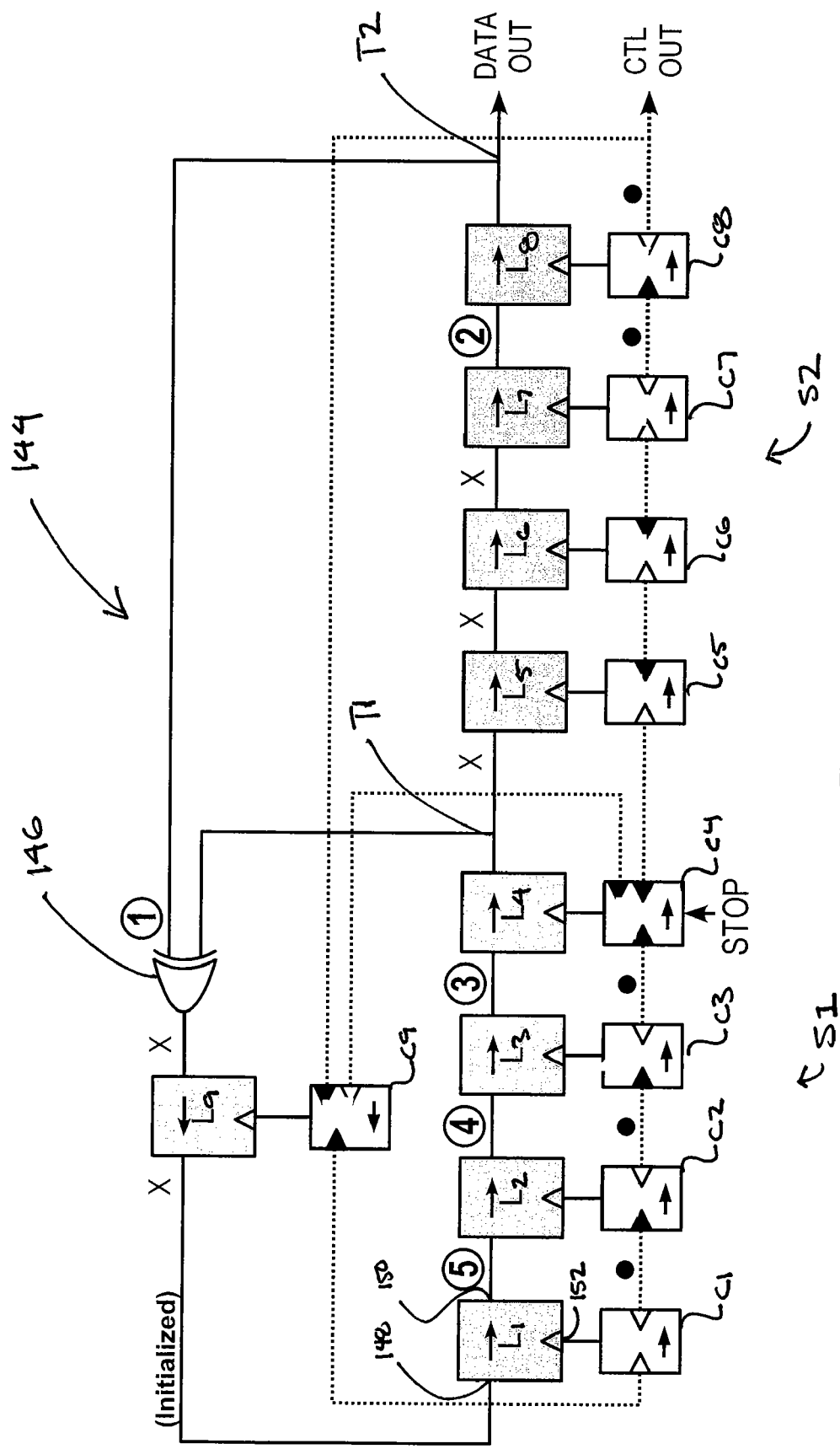
FIGS. 15A-15D are logic diagrams illustrating a reconfigurable circuit configured to generate a pseudo random bit sequence, with FIG. 15A illustrating data and token initialization and the following diagrams as data and token movement through the circuit.
Figure 15B:
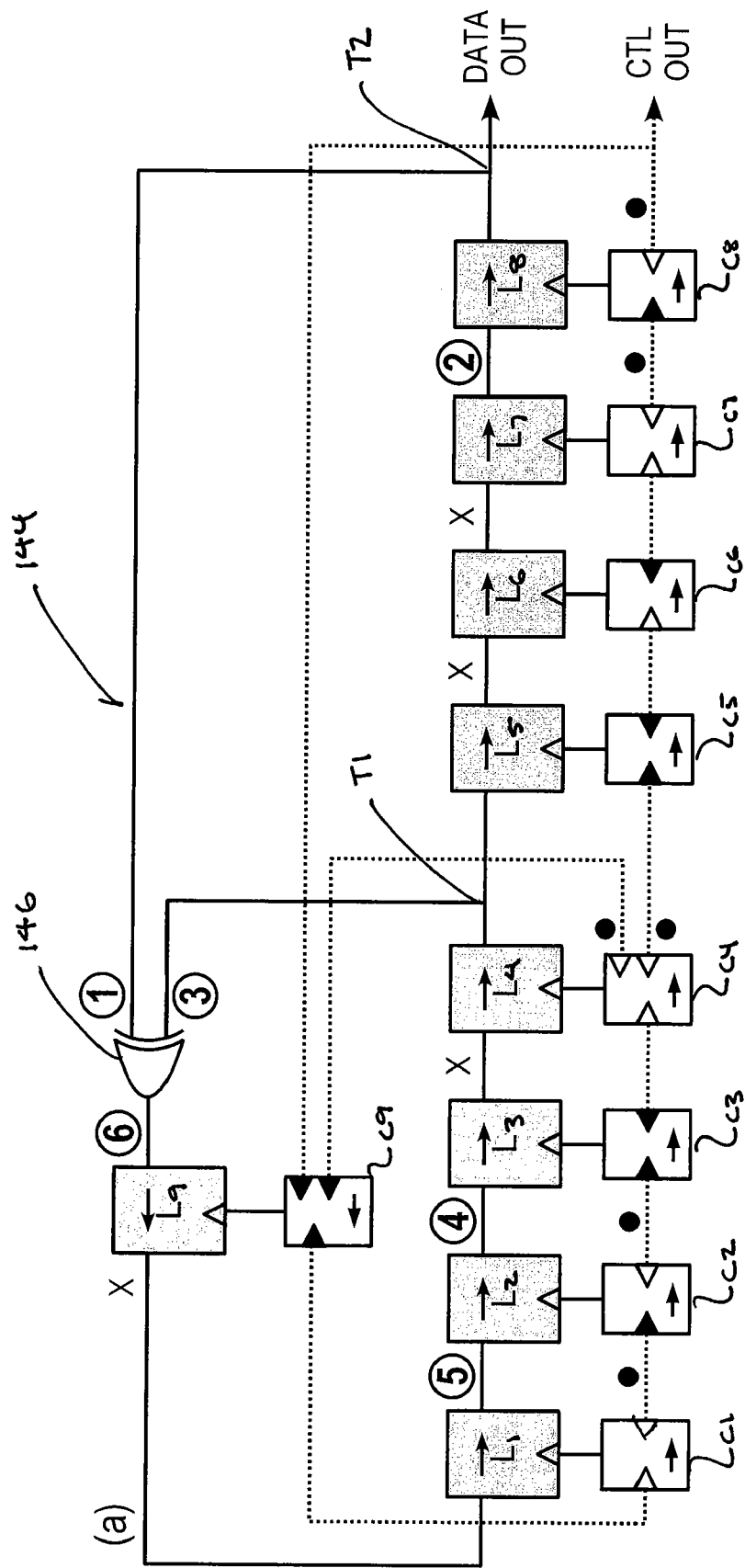
Figure 15C:
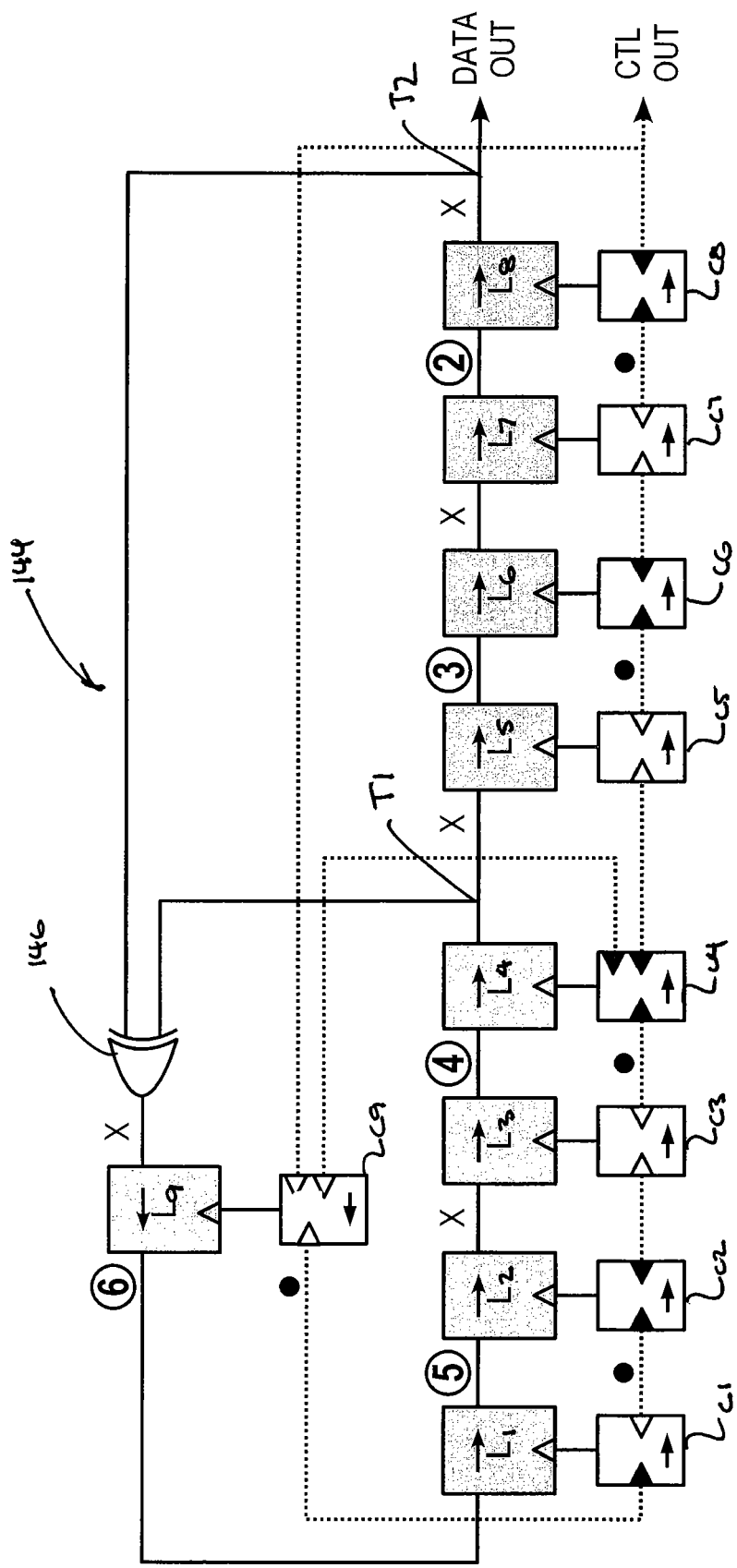
Figure 15D:
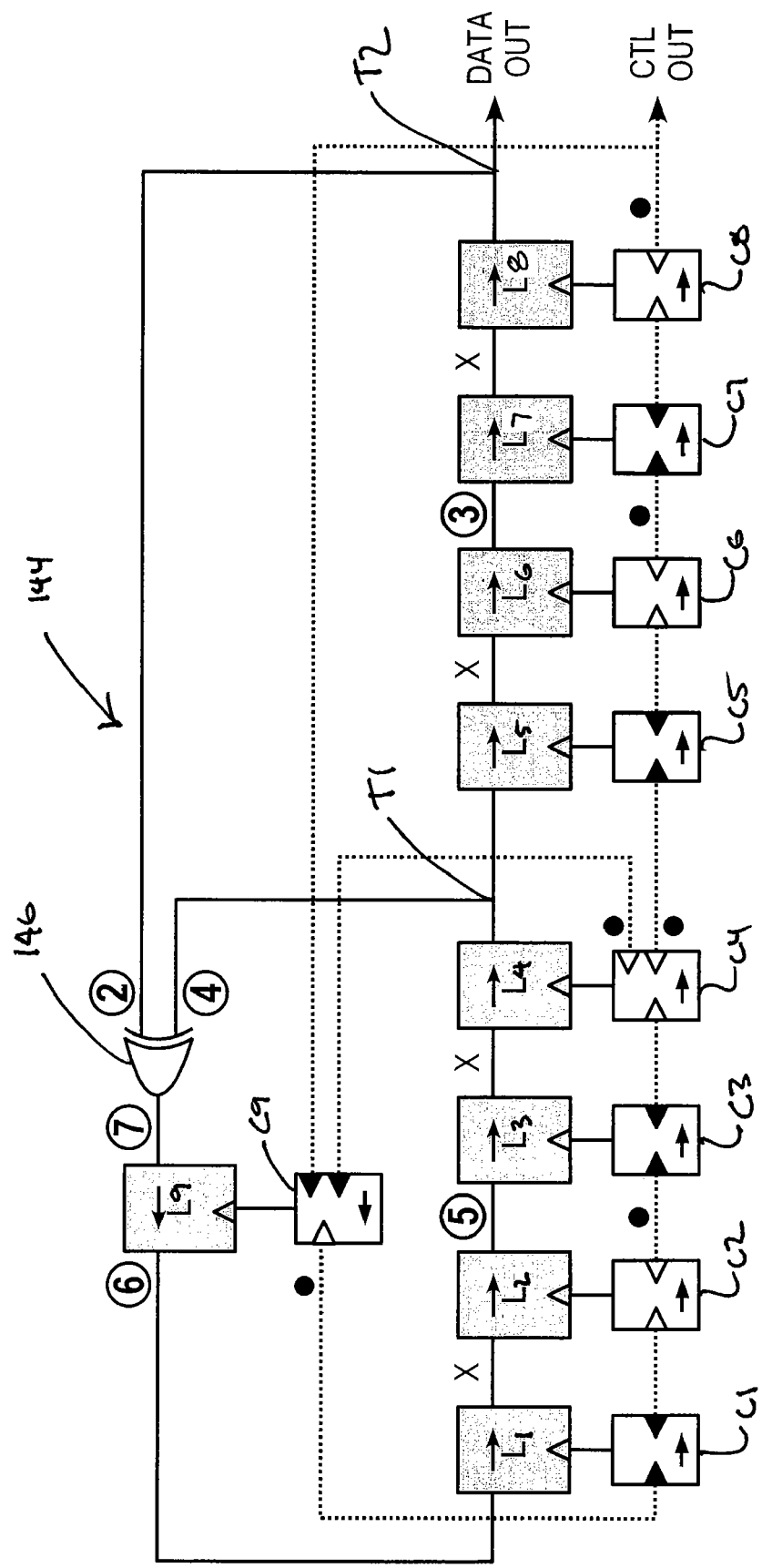
Figure 16:
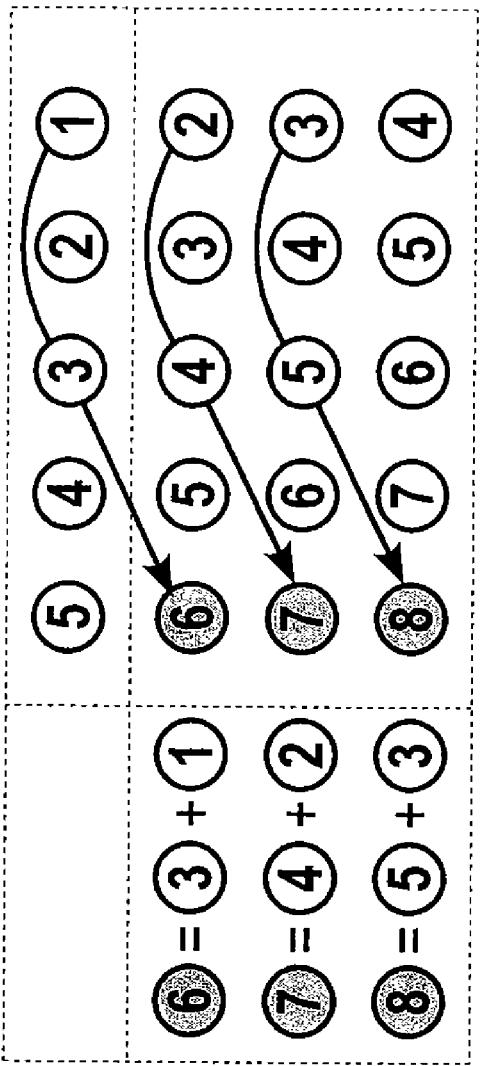
FIG. 16 is a table illustrating the progression of data through the circuit and the operation of the XOR gate to generate data items 6, 7 and 8.

FIG. 15(A) illustrates one example of data and control token initialization. With the initialization illustrated, the PRBS 146 of FIG. 15 will generate the same 31 bit sequence as FIG. 14. Thus, the data is initialized as 10101, with data values of 1 at L1 (5), 0 at L2 (4), 1 at L3 (3), 0 at L7 (2) and 1 at L8 (8) (which is also one input to XOR gate 146) FIG. 15(B)-FIG. 15(D) illustrate the movement of data and tokens after initialization. First, it is noted in FIG. 15(A) that control element (C4) has a trigger or stopper input. An appropriate signal on the trigger input starts the circuit. Still referring to FIG. 15(A), it can be seen that control element C4 is active, and the other control elements are inactive. Referring now to FIG. 15(B) and referring to L4 and C4, when the trigger input is activated, the control element C4 fires, providing a signal to the control input of L4. The data at the input to L4 is passed to the output of L4. Hence, as the output of L4 is tapped and provides an input to the XOR gate, the data is also at the input of the XOR gate. At the same time, the token at the predecessor port of C4 is duplicated at the two successor ports of C4. Hence, a token is now at one of the predecessor ports of C9 and the duplicated token is also at the predecessor port of C5.

FIG. 15(B) illustrates the data and token flow after FIG. 15(A). Here, C3, C5 and C9 are now active. Hence, L3 fires allowing the data at the input to L3 to propagate to the output of L3 (input of L4) and the token at the predecessor port of C3 moves to the successor port of C3 (predecessor port of C4). Similarly, L5 first allowing the data at the input to L5 to propagate to the output of L5 (input of L6) and the token at the predecessor port of C5 moves to the successor port of C5 (predecessor port of C6). Finally, C9 fires activating L9. A data value of 1 (from L4) and a data value of 1 (from L8) are at the inputs to the XOR with an output of 0. The data value 0 is propagated from the XOR output to the output of L9 (input of L1). The circuit continues to operate in a similar fashion, with control token propagating through the circuit synchronously with data values. The first output of the circuit is a data value 1, the following outputs are 0101. The sixth output of the circuit was generated by the XOR gate and it is a 0.

Unlike the synchronous fixed pseudo random sequence generator of FIG. 15, it is possible to provide more or fewer data values and tokens in the circuit of FIG. 15 in order to provided various different pseudo random bit sequences.

FIG. 15(C) illustrates the data and token flow after FIG. 15(B). Here, C2, C4, C6 and C8 are active. C2 fires propagating the token and the data to C3 and L3, respectively. C4 propagates a control token to C9 and C5, and L4 propagates data to L5 and the XOR gate. C6 propagates a control token to C7 and L6 propagates data to L7. Finally, the 0 data value at L8 is propagated to its output, and the control token at the predecessor port of C8 is duplicated to the two successor ports of C8. Hence, a control token is available at the control output when data is available at the data output. Hence, in this example, the second bit in the pseudo random sequence is 0.

FIG. 15(D) shows that control elements C1, C3, C5 and C7 are next active, and have valid data at the associated latches L1, L3, L5 and L7. The next value of the XOR gate output will be the result of the exclusive or operation on data values 2 and 4, to yield data value 7. In the present example, data value 2 is 0 and data value 4 is also 0, hence the data value 7 will be a 0. Hence, the seventh value of the pseudo random bit sequence will be 0, as is the case of the sequence generated by FIG. 14.

Although the reconfigurable circuits proposed herein are intrinsically asynchronous, they can be used synchronously by adding input and output clock interface stages. These circuits can therefore be used in any traditional synchronous system. As long as the minimum asynchronous throughput is greater than the clock rate, the throughput is constant, and no synchronization is necessary. Examples of asynchronous-to-clocked interface circuits are well-established, some of which are described in G. K. Konstadinidis et al., "*Implementation of a Third-Generation 1.1-GHz 64-bit Microprocessor,*"

IEEE Journal of Solid-State Circuits and Systems, Vol. 37, No. 11, November 2002, pp. 1461-1469 and W. Coates and R. Drost, "*Congestion and Starvation Detection for Ripple FIFOs*," Proc. 9th Intl. Symp. on Advanced Research in Asynchronous Circuits and Systems, Vancouver, Canada, 12-16 May 2003, pp. 36-45, which are both hereby incorporated by reference herein.

With asynchronous data path with asynchronous control, the throughput varies for different token distributions. For the GasP circuit implementations, the optimal occupancy for maximum throughput is 4/6 full. The variation in throughput can be avoided by using the generator synchronously, taking the output through asynchronous-to-clocked interfaces. As long as the minimum asynchronous throughput is greater than the clock rate, the throughput is constant, and no synchronization is necessary. One can also use sequential-concurrent-sequential (SCS) FIFOs to increase the range of occupancies that allow full throughput operation, such as set forth in E. Brunvand, "*Low latency self-timed flow-through FIFOs*," Proc. 6th Conf. on Advanced Research in VLSI, Chapel Hill, 27-29 Mar. 1995, pp. 76-90, which is hereby incorporated by reference herein.

Aspects of reconfigurable circuits presented herein have a very large application space, and can be exploited in many areas of digital design, especially in digital signal processing. The following provides a discussion of a few of many interesting applications in which reconfigurable circuits may be employed. Examples of specific application areas include:

- coding for error correction and detection (e.g. CRC),
- encryption (ciphers, deciphers),
- line coding,
- spread-spectrum communication systems (e.g. CDMA, FH-SS),
- digital filtering (FIR and IIR filters),
- source coding (encoders and decoders), and
- compression.

These structures are extensions of the feed-forward and feed-back configurations presented above. Most of these applications build on the general notion of generator polynomials such as is set out in S. Golomb, Shift Register Sequences, Laguna Hills: Aegean Park Press, 1981, which is hereby incorporated by reference herein.

Because the reconfigurable circuits presented herein can be used in a wide application space in the form of many different possible configurations, we cannot discuss every application in detail. Instead, this paper discusses the fundamentals of constructing reconfigurable circuits using asynchronous data path with asynchronous control for any application in digital design. The example set forth in FIGS. 17-22 show the logical arrangement of memory/control element blocks (e.g., a latch with a GasP element providing a trigger input to the latch as described earlier). Each pair is illustrated as a single logical block, labeled 1, 2, 3, etc., with various tap arrangements and feed-back and feed-forward configurations, labeled with appropriate arrows, as well as connections to logic. Inputs and outputs to the circuit are labeled with "IN" and "OUT". Finally, these circuits are shown in their logical configuration, as opposed to their physical configuration. Hence, each logical block (1, 2, etc.) may be realized with one or more physical stages, and the appropriate initial distribution of data and tokens to the circuit to achieve the illustrated logical arrangement.

Figure 17:
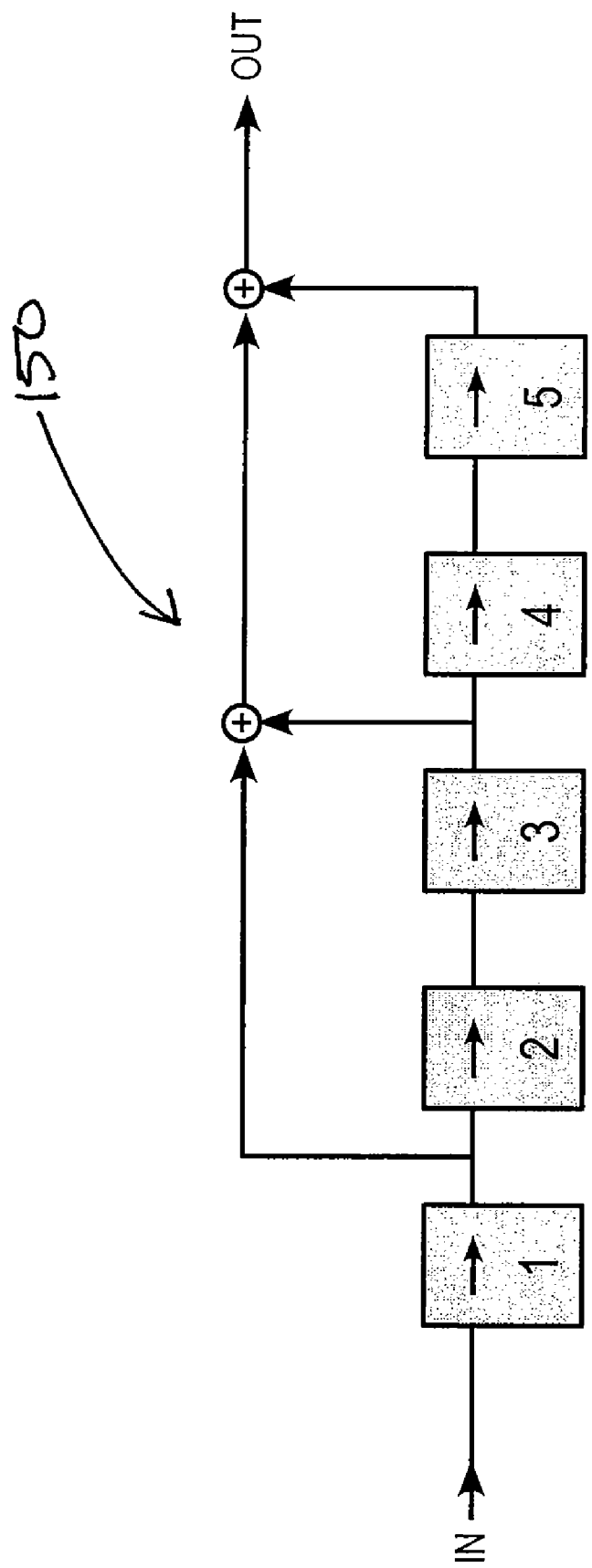
FIGS. 17-22 are circuit diagrams illustrating various possible reconfigurable circuit implementations.

Convolution codes are often used for error correction and line coding. Convolution encoders are often described by the notation (n, k, m) where n is the number of output bits, k is the number of input bits, and m is the memory depth of the encoder (i.e. the maximum number of shift register or stages along a particular branch). Convolution encoders are so-called because each output is the binary convolution of the input with the generator polynomial of the circuit tap structure that produces the output. The generator polynomial is the discrete-time unit impulse response of the circuit tap structure, which is the output produced by an input string with a lone '1' bit. For example, the impulse response of the convolution circuit 150 of FIG. 17 is 10101 . . . , and the corresponding generator polynomial is G=10101. Mathematically, the output bit sequence can be written as:

$$out[t] = \sum_{i=0}^{\infty} G[i] \cdot in[t-i] = \overline{G} * \overline{in} \tag{5}$$

which is simply the convolution of the input sequence with the circuit's generator polynomial. Note that in signal processing applications, circuits are often described using transfer function notation instead. The circuit of FIG. 17 has a transfer function[§] $H(z)=1+z^{-2}+z^{-4}$.

[§] The transfer function describes the output-input relationship of a system. For discrete-time systems, it is often expressed in terms of the z-transform, which is analogous to the Laplace transform for continuous-time systems. $z^{-1}$ is the z-transform of a unit delay.

In general, a convolution encoder may produce j outputs from l inputs. Each output is then:

$$\overline{out}_y = \sum_{x=1}^{l} \overline{G}_y * \overline{in}_x. \tag{6}$$

The following discussion involves two main types of convolution encoders: non-recursive and recursive.

Figure 18:
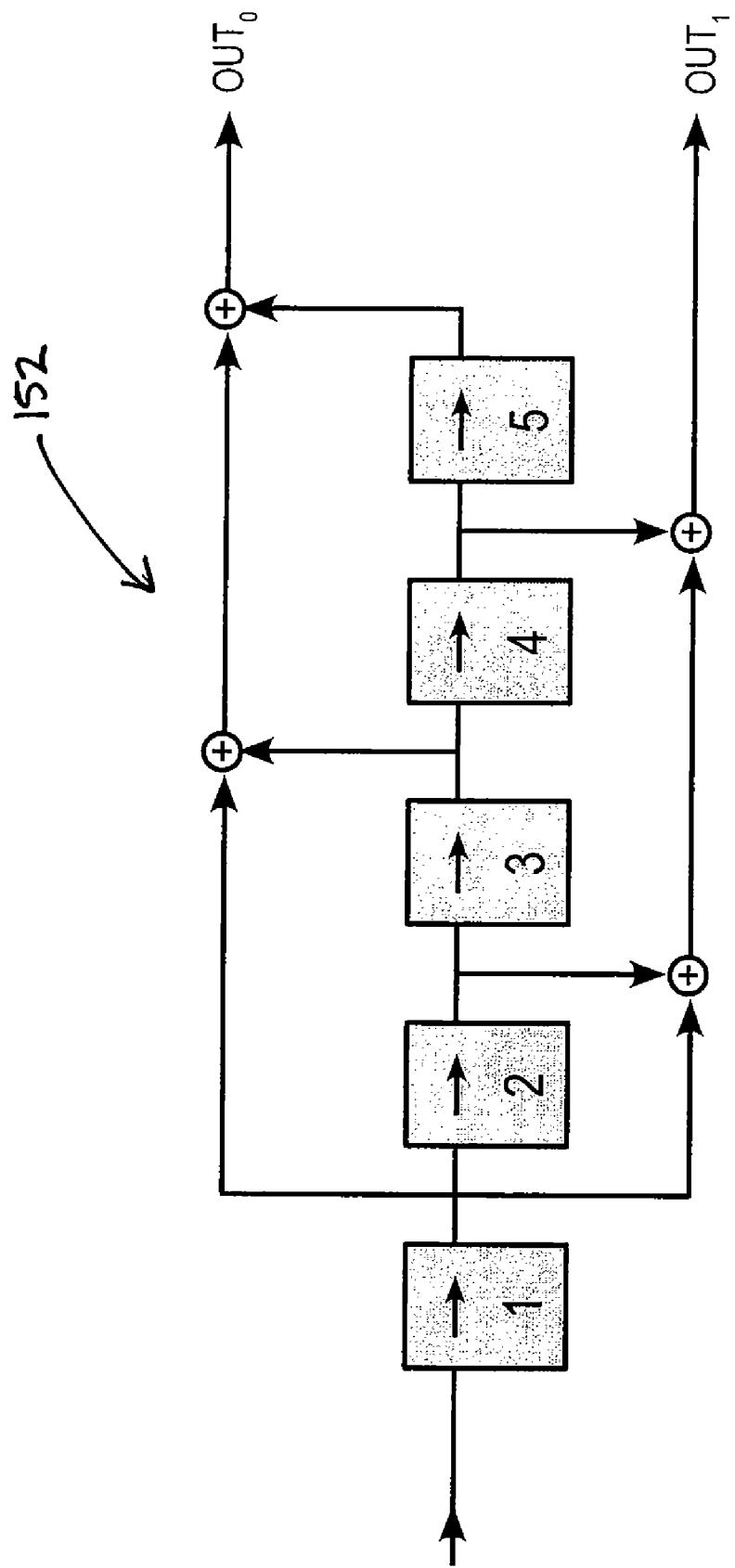

FIG. 18 shows an example of a non-recursive convolution encoder 152 with two outputs (n=2), one input (k=1), and five logical stages (m=5); therefore it is a (2,1,5) encoder. The generator polynomials and transfer functions for each output are:

$G_0$=10101

$G_1$=1101

$H_0(z)=z^{-1}+z^{-3}+z^{-5}$ $H_1(z)=z^{-1}+z^{-2}+z^{-4}$. (7)

In this example, the number of stages (1-5) (memory element and GasP or other control elements) is in the logical rather than physical number of memory elements. Hence, the diagrams illustrate the functional/logical circuit based on the distribution of tokens. Non-recursive encoders typically have a feed-forward structure, and can be easily built using asynchronous data path with asynchronous control from the basic structure presented above with reference to various figures. To illustrate the configurable nature, the diagram shows that between one and N stages (memory element and control element) may be provided between each tap. The distribution of tokens to the stages will then determine the generation number and polynomial transfer function of the circuit; how the circuit is reconfigurable based on token distribution.

Figure 19:
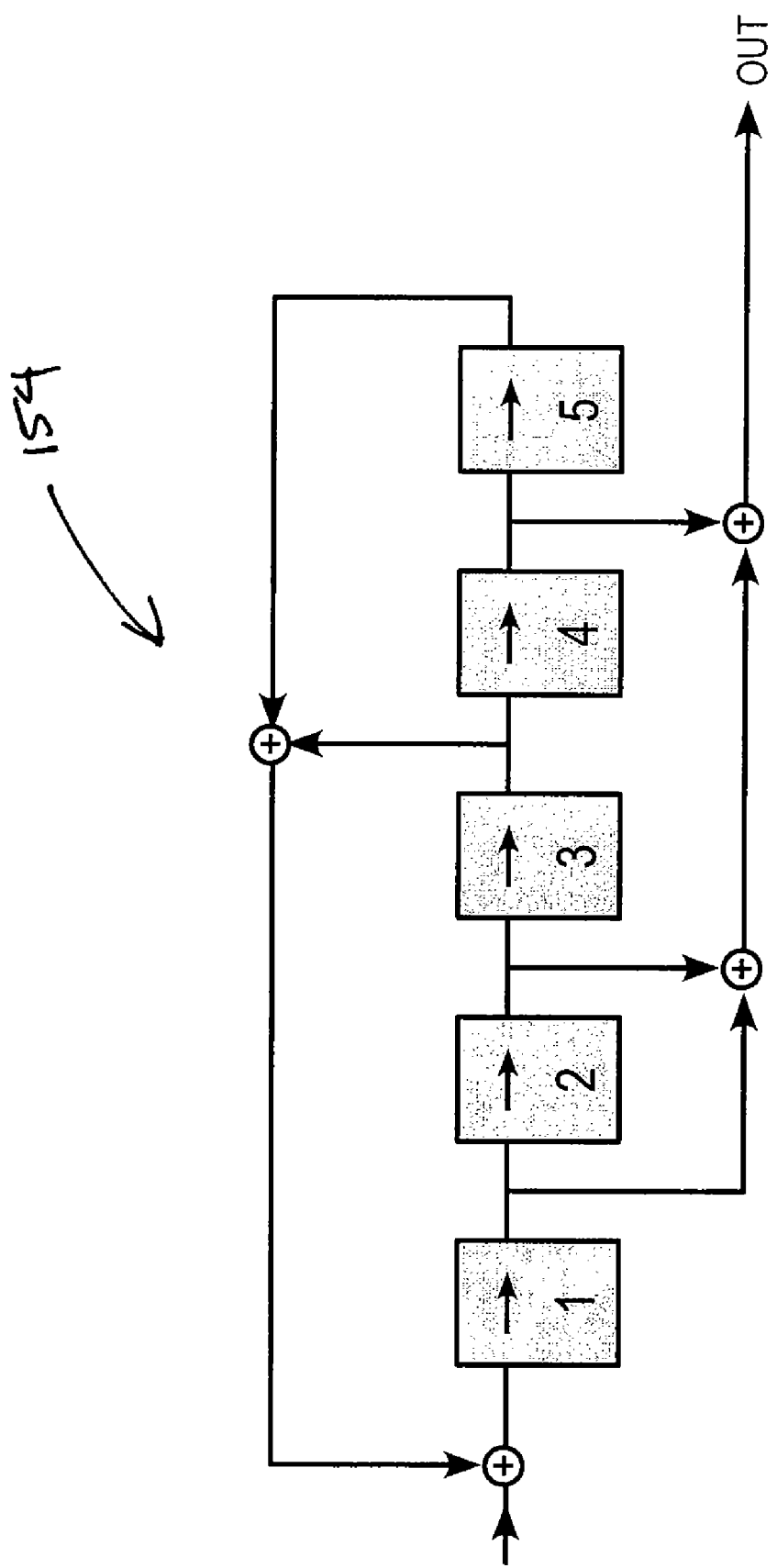

FIG. 19 shows an example of a recursive convolution encoder 154, in which the input to the encoder depends on the current state of the memory element portion of the stages 1-5. The structure of a recursive convolution encoder has a feed-back configuration, but may also involve one or more feedforward paths. The feed-back path can be described by a generator polynomial $G_{FB}=+x^5+x^3+1$. The transfer functions of the feed-forward and feed-back paths are given by:

$$H_{FF}(z)=z^{-1}+z^{-2}+z^{-4}$$

$$H_{FS}(z)=1+z^{-3}+z^{-5} \tag{8}$$

and the output transfer function is:

$$H(z) = \frac{z^{-1}+z^{-2}+z^{-4}}{1+z^{-3}+z^{-5}}. \tag{9}$$

Recursive encoders can be built using asynchronous data path with asynchronous control from the basic structure presented above. Doing so provides configurability which allows the circuit to implement different transfer functions and generator polynomials.

A cyclic redundancy check (CRC) is used to detect errors in data storage and transmission. By computing and comparing the hash function, or checksum, of a stream of data, the data recipient may detect whether any bit errors have occurred. A checksum is often the remainder of a division of the input stream by some generator polynomial. Different generator polynomials are used for different CRC algorithms.

Figure 20:
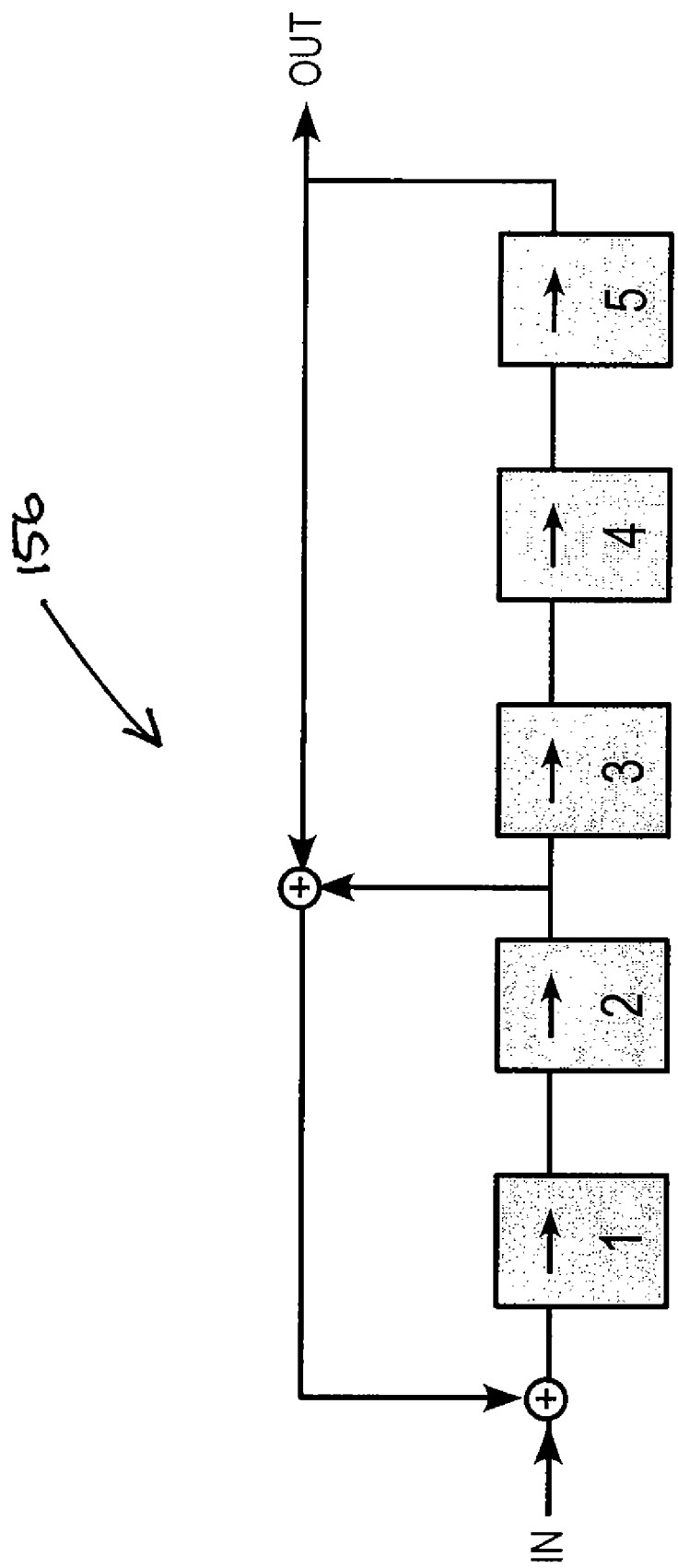

FIG. 20 shows a circuit 156 for producing a CRC-5 checksum, which is the remainder of dividing the input bit stream by the polynomial $x^5+x^2+1$. Above, with respect to FIGS. 12 and 15 it was observed how it is possible to implement this circuit using an asynchronous data path with asynchronous control (with appropriate logic attached thereto), as well as how to reconfigure that circuit to also implement CRC-7 (FIG. 13). A circuit of the same form can also perform the inverse operation. This can be used for signature analysis, for example.

Figure 21:
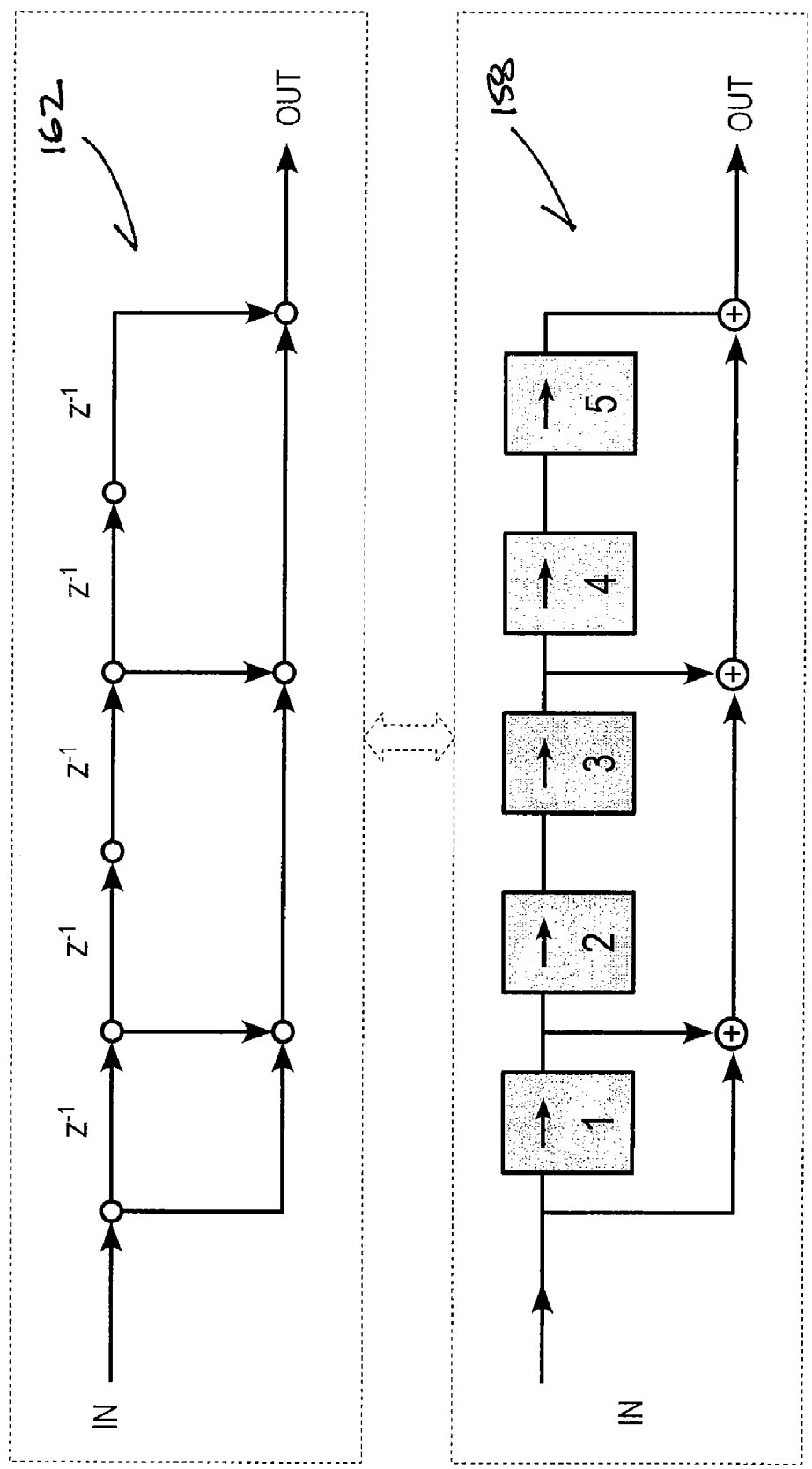
Figure 22:
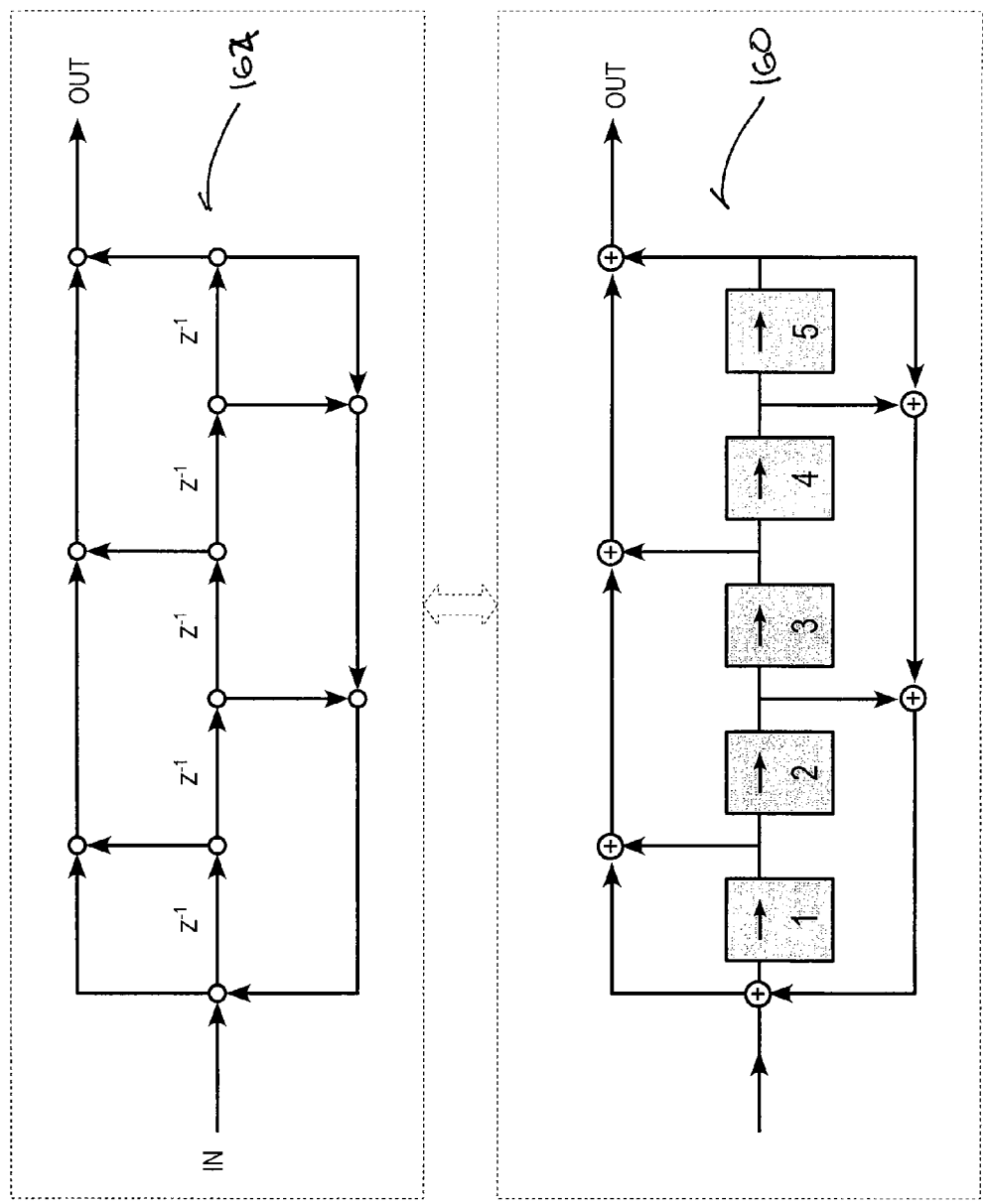

Digital filters are used ubiquitously in digital signal processing applications. There are two main types of digital filters: finite-impulse-response (FIR) and infinite-impulse-response (IIR). Typically, FIR filters have feed-forward configurations, while IIR filters have feed-back configurations. FIGS. 21 and 22 show the basic network structures of an FIR 158 and an IIR filter 160, respectively, as signal processing flow graphs 162, 164 and their corresponding implementations 158, 160.

The filter structures 154 and 156 shown in FIGS. 18 and 19 are very similar to those of convolution encoders. In general, however, the taps of digital filters may have gains that are other than 0 or 1. With a asynchronous data path with asynchronous control of some physical length and number of physical taps and the appropriate logic coupled thereto (e.g., through taps), it is possible through distribution of tokens to less than or equal to all the stages of the reconfigurable circuit to logically implement various different FIR or IIR filter with only one physical implementation.

This disclosure presents only a small subset of many potential applications of the reconfigurable circuits. The circuit structures set out herein can be employed in all discrete-time systems that need to implement different permutations of some logic. As costs of chip fabrication start to become prohibitive, reconfigurable circuits should become increasingly attractive. One can envision building dedicated reconfigurable circuitry on digital signal processors (DSPs) and application-specific ICs (ASICs) that can be used for a wide variety of applications. They can also be used in field-programmable gate arrays (FPGAs); today, many logical blocks are implemented on FPGAs using lookup tables. Though these are configurable, they have very low performance. Having dedicated reconfigurable hardware in these chips provides configurability and high performance.

In presenting the example circuit structures, we have assumed that signals are discrete-time and digital. However, the proposed circuits can be employed in all discrete-time systems, whether analog or digital. In the case of a discrete-time analog system, each storage element is an analog memory element, which can be implemented as a unity-gain amplifier with an analog pass-gate, for example.

It should be noted that, the embodiments may be fully or partially implemented by any programmable or hardcoded logic, such as field programmable gate arrays (FPGAs), transistor transistor logic (TTL), or application specific integrated circuits (ASICs). Additionally, the embodiments of the present invention may be performed by any combination of programmed general-purpose computer components and/or custom hardware components. Therefore, nothing disclosed herein should be construed as limiting the various embodiments of the present invention to a particular embodiment wherein the recited embodiments may be performed by a specific combination of hardware components.

While the disclosed embodiments are described in specific terms, other embodiments encompassing principles of the invention are also possible. Further, operations may be set forth in a particular order. The order, however, is but one example of the way that operations may be provided. Operations may be rearranged, modified, or eliminated in any particular implementation while still conforming to aspects of the invention.

The invention claimed is:

1. A reconfigurable circuit comprising:
an asynchronous data path with asynchronous control;
at least one logic element coupled with the asynchronous data path with asynchronous control; and
the asynchronous data path and the least one logic element configurable to at least two logical implementations by initializing the asynchronous data path with at least a first combination of valid data items and control tokens and at least a second combination of valid data items and control tokens different from the first combination.

2. The reconfigurable circuit of claim 1 wherein:
the asynchronous data path comprises:
a plurality of interconnected storage elements;
a plurality of interconnected control elements, each of the plurality of control elements operatively coupled with one of the respective storage elements; and
one or more of the plurality of storage elements configured to be initialized with a valid data item and the corresponding control element configured to be initialized with a control token, such that a number of valid data items is less than or equal a number of storage elements in the asynchronous data path; and
the asynchronous data path configured to propagate valid data items through the plurality of interconnected storage elements in response to activation of the plurality of interconnected control elements.

3. The reconfigurable circuit of claim 2 further comprising:
each storage element including a data input, a data output, and a control input, each storage element configured to shift valid data items at the data input to the data output upon receipt of a control signal at the control input, the plurality of storage elements defining a data path;
each control element including a control output coupled with the control input of a respective one of the plurality of storage elements, each control element further defining an input port and an output port, each control element configured to propagate a control token from the input port to the output port, the plurality of control elements defining a control path;

the data path including a data initializing input configured to receive the valid data items and provide the valid data items to one or more of the plurality of storage elements;

the control path including a control initializing input configured to receive one or more control tokens, the one or more control tokens initializing each of the plurality of control elements associated with a valid data item.

4. The reconfigurable circuit of claim 2 wherein the at least one logic element includes at least one input and at least one output, the at least one input coupled with the data output of one of the plurality of storage elements.

5. The reconfigurable circuit of claim 4 wherein the at least one of the plurality of control elements is a duplicating type GasP element or a merging type GasP element.

6. The reconfigurable circuit of claim 2 wherein:
the plurality of interconnected storage elements includes a first plurality of interconnected storage elements coupled in parallel with at least a second plurality of interconnected storage elements; and
each of the plurality of control elements operatively coupled with one of the first plurality of storage elements and one of the second plurality of storage elements.

7. The reconfigurable circuit of claim 1 wherein each storage element is a latch and each control element is a GasP element, the GasP elements being activated when a predecessor port of a first GasP element has a control token and a successor port of a following second GasP element does not have a control token, the valid data items being copied from an input port of a second latch coupled with the second GasP element to the output port of the second latch and the control token being propagated from a predecessor port of the second GasP element to the successor port of the second GasP element.

8. The reconfigurable circuit of claim 1 further comprising at least one of a feedback path and a feed forward path.

9. The reconfigurable circuit of claim 1 further comprising an asynchronous to synchronous interface coupled with the asynchronous data path.

10. The reconfigurable circuit of claim 1 wherein the at least one logic element comprises means for performing a logical operation.

11. A processor including the reconfigurable circuit of claim 1.

12. A method of reconfiguring a reconfigurable circuit comprising:
accessing an asynchronous data path with asynchronous control, the asynchronous data path including at least one logic element coupled with the asynchronous data path; and initializing the asynchronous data path and the least one logic element with a first combination of valid data items and control tokens to achieve a first logical implementation; and initializing the asynchronous data path and the at least one logic element with a second combination of valid data items and control tokens to achieve a second logical implementation, the second combination being different from the first combination.

13. The method of reconfiguring the reconfigurable circuit of claim 12 further comprising:
accessing the asynchronous data path, wherein the asynchronous data path comprises:
a plurality of interconnected storage elements;
a plurality of interconnected control elements, each of the plurality of control elements operatively coupled with one of the respective storage elements; and
initializing a first combination of one or more of the plurality of storage elements with corresponding first valid data items;
initializing the control elements associated with the first combination of one or more of the plurality of storage elements with corresponding first control tokens to configure the reconfigurable circuit in a first logical implementation;
initializing a second combination of one or more of the plurality of storage elements with corresponding second valid data items; and
initializing the control elements associated with the second combination of one or more of the plurality of storage elements with second control tokens to configure the reconfigurable circuit in a second logical implementation.

14. The method of claim 13 wherein each of the plurality of interconnected storage elements includes a first latch and the plurality of control elements includes a first GasP element operatively coupled with the first latch, the method further comprising:
copying a valid data item from an input of the first latch to the output the first latch when a successor port of the first GasP element has a control token and a second successor port of a second GasP element does not have a control token, the second GasP element having a second predecessor port coupled with the first successor port.

15. The method of claim 12 further comprising:
asynchronously sampling an output of the reconfigurable circuit upon receipt of a control token in association with the output of the reconfigurable circuit.

16. The method of claim 12 further comprising:
coupling an asynchronous output of the reconfigurable circuit with an asynchronous to synchronous interface.

* * * * *

UNITED STATES PATENT AND TRADEMARK OFFICE
CERTIFICATE OF CORRECTION

PATENT NO. : 7,701,254 B2
APPLICATION NO. : 12/047488
DATED : April 20, 2010
INVENTOR(S) : Alex Chow et al.

It is certified that error appears in the above-identified patent and that said Letters Patent is hereby corrected as shown below:

In column 1, line 4, delete "APPLICATIONS" and insert -- APPLICATION --, therefor.

In column 5, line 5, delete "1 ." and insert -- I. --, therefor.

In column 6, line 38, delete "N≦N'" and insert -- N≦N', --, therefor.

In column 7, line 61, delete " $out_1[t]=b_k[t] \lor b_{k+5}[t].$ " and insert -- $out_1[t]=b_k[t] \lor b_{k+3}[t].$ --, therefor.

In column 15, line 2, delete " $G_{FB}=+x^5+x^3+1.$ " and insert -- $G_{FB}=x^5+x^3+1.$ --, therefor.

In column 15, line 6, delete " $H_{FS}(z)=1+z^{-3}+z^{-5}$ " and insert -- $H_{FB}(z)=1+z^{-3}+z^{-5}$ --, therefor.

Signed and Sealed this
Twelfth Day of April, 2011

David J. Kappos
*Director of the United States Patent and Trademark Office*